United States Patent
Atchley et al.

(10) Patent No.: US 9,780,719 B2
(45) Date of Patent: Oct. 3, 2017

(54) EAST-WEST PHOTOVOLTAIC ARRAY WITH SPACED APART PHOTOVOLTAIC MODULES FOR IMPROVED AERODYNAMIC EFFICIENCY

(71) Applicant: SolarCity Corporation, San Mateo, CA (US)

(72) Inventors: Brian Atchley, San Rafael, CA (US); Geoffrey Fedoroff, San Rafael, CA (US); Joe O'Connor, San Rafael, CA (US); Jack Raymond West, San Rafael, CA (US); Ian Crecelius, San Rafael, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

(21) Appl. No.: 14/625,259

(22) Filed: Feb. 18, 2015

(65) Prior Publication Data

US 2016/0056752 A1    Feb. 25, 2016

Related U.S. Application Data

(60) Provisional application No. 62/040,664, filed on Aug. 22, 2014.

(51) Int. Cl.
*H02S 20/23* (2014.01)
*H01L 31/18* (2006.01)
(Continued)

(52) U.S. Cl.
CPC .............. *H02S 20/23* (2014.12); *F24J 2/526* (2013.01); *F24J 2/5233* (2013.01); *F24J 2/5239* (2013.01);
(Continued)

(58) Field of Classification Search
CPC ........ H02S 20/23; H02S 30/10; H02S 20/24; F24J 2/5256; F24J 2/5203; F24J 2/5262;
(Continued)

(56) References Cited

U.S. PATENT DOCUMENTS

| | | |
|---|---|---|
| 4,371,139 A | 2/1983 | Clark |
| 5,316,592 A | 5/1994 | Dinwoodie |

(Continued)

FOREIGN PATENT DOCUMENTS

| | | |
|---|---|---|
| DE | 100 47 400 A1 | 4/2002 |
| DE | 10 2005 007184 B3 | 6/2006 |

(Continued)

OTHER PUBLICATIONS

PanelClaw "Grizzly Bear Flat Roof Mounting System", http://www.panelclaw.com/grizzly-bear.html, pp. 1-2, retrieved May 6, 2014.

(Continued)

*Primary Examiner* — Stanton L Krycinski
(74) *Attorney, Agent, or Firm* — Kilpatrick Townsend & Stockton LLP

(57) ABSTRACT

A solar array with successive rows of photovoltaic modules angled in opposing directions forming peaks and valleys between the rows with the valleys (i.e.: lower sides of the photovoltaic module rows) being mounted close together and the peaks (i.e.: upper sides of the photovoltaic module rows) being mounted far apart to improve system aerodynamics and permit ease of access for installers. Included is a system for connecting the upper sides of the photovoltaic modules to connectors that slide on bars extending between upper and lower mounting bases and for pivot locking the lower sides of the photovoltaic modules to the lower mounting bases.

17 Claims, 21 Drawing Sheets

(51) Int. Cl.
*F24J 2/52* (2006.01)
*H02S 20/24* (2014.01)
*H01L 31/042* (2014.01)
*F24J 2/46* (2006.01)

(52) U.S. Cl.
CPC ........... *F24J 2/5245* (2013.01); *F24J 2/5254* (2013.01); *F24J 2/5256* (2013.01); *F24J 2/5262* (2013.01); *F24J 2/5264* (2013.01); *H01L 31/18* (2013.01); *H02S 20/24* (2014.12); *F24J 2002/4663* (2013.01); *F24J 2002/5216* (2013.01); *F24J 2002/5292* (2013.01); *H01L 31/042* (2013.01); *Y02B 10/12* (2013.01); *Y02E 10/47* (2013.01); *Y02P 70/521* (2015.11)

(58) Field of Classification Search
CPC .. F24J 2/5233; F24J 2/5239; F24J 2002/5292; F24J 2002/4663; H01L 31/18; H01L 31/042
See application file for complete search history.

(56) References Cited

U.S. PATENT DOCUMENTS

| | | | |
|---|---|---|---|
| 5,505,788 A | 4/1996 | Dinwoodie | |
| 5,746,839 A | 5/1998 | Dinwoodie | |
| 6,360,491 B1* | 3/2002 | Ullman | E04D 13/12 248/156 |
| 6,672,018 B2* | 1/2004 | Shingleton | F24J 2/5205 126/621 |
| 6,809,251 B2 | 10/2004 | Dinwoodie | |
| D633,033 S | 2/2011 | Conger | |
| D648,269 S* | 11/2011 | Conger | D13/102 |
| 8,156,697 B2* | 4/2012 | Miros | F24J 2/5205 126/623 |
| 8,276,330 B2* | 10/2012 | Harberts | F24J 2/5239 136/244 |
| 8,336,277 B1 | 12/2012 | Rego et al. | |
| 8,505,248 B1 | 8/2013 | Leong et al. | |
| 8,522,491 B2* | 9/2013 | Kneip | F24J 2/523 52/173.3 |
| 8,558,101 B2* | 10/2013 | Mascolo | F24J 2/4636 136/243 |
| 8,640,423 B2* | 2/2014 | Meppelink | F24J 2/5237 126/704 |
| 8,683,761 B2* | 4/2014 | Danning | H02S 20/23 136/251 |
| 8,752,338 B2* | 6/2014 | Schaefer | F24J 2/5245 52/173.3 |
| 8,829,330 B2* | 9/2014 | Meyer | F24J 2/16 136/243 |
| 8,875,455 B1* | 11/2014 | Yang | F24J 2/5245 126/623 |
| D738,820 S* | 9/2015 | Beck | D13/102 |
| 9,194,612 B2* | 11/2015 | Bragagna | H02S 20/00 |
| 9,263,985 B2* | 2/2016 | Silberschatz | H02S 30/10 |
| 2003/0070368 A1* | 4/2003 | Shingleton | F24J 2/5205 52/173.3 |
| 2003/0101662 A1* | 6/2003 | Ullman | E04D 13/12 52/27 |
| 2003/0177706 A1* | 9/2003 | Ullman | E04D 13/12 52/3 |
| 2004/0007260 A1 | 1/2004 | Dinwoodie | |
| 2004/0250491 A1* | 12/2004 | Diaz | F24J 2/5237 52/518 |
| 2007/0144575 A1 | 6/2007 | Mascolo et al. | |
| 2007/0151594 A1 | 7/2007 | Mascolo et al. | |
| 2008/0029144 A1 | 2/2008 | Brazier et al. | |
| 2009/0134291 A1* | 5/2009 | Meier | F24J 2/5233 248/222.14 |
| 2009/0242014 A1 | 10/2009 | Leary | |
| 2010/0089390 A1* | 4/2010 | Miros | F24J 2/5239 126/608 |
| 2010/0179678 A1 | 7/2010 | Dinwoodie et al. | |
| 2010/0193012 A1 | 8/2010 | Klammer et al. | |
| 2010/0243023 A1* | 9/2010 | Patton | F24J 2/4607 136/244 |
| 2011/0000526 A1* | 1/2011 | West | F24J 2/5211 136/251 |
| 2012/0048351 A1* | 3/2012 | Rizzo | F24J 2/5239 136/251 |
| 2012/0132260 A1* | 5/2012 | Hirsch | F24J 2/5233 136/251 |
| 2012/0152326 A1 | 6/2012 | West et al. | |
| 2012/0174913 A1* | 7/2012 | Salzer | F24J 2/5235 126/704 |
| 2012/0223033 A1 | 9/2012 | Molek | |
| 2012/0234378 A1* | 9/2012 | West | F24J 2/5211 136/251 |
| 2012/0273029 A1 | 11/2012 | Bragagna et al. | |
| 2012/0298817 A1* | 11/2012 | West | F24J 2/5211 248/220.22 |
| 2012/0301661 A1* | 11/2012 | West | F24J 2/5211 428/99 |
| 2013/0011187 A1 | 1/2013 | Schuit et al. | |
| 2014/0026946 A1* | 1/2014 | West | F24J 2/5205 136/251 |
| 2014/0130847 A1* | 5/2014 | West | F24J 2/5211 136/251 |
| 2014/0130849 A1* | 5/2014 | Silberschatz | H02S 30/10 136/251 |
| 2014/0158184 A1* | 6/2014 | West | H01L 31/048 136/251 |
| 2014/0174510 A1* | 6/2014 | Kanbara | H01L 31/0482 136/251 |
| 2014/0182663 A1* | 7/2014 | Kuo | H01L 31/0422 136/251 |
| 2014/0261642 A1* | 9/2014 | Beck | F24J 2/523 136/251 |
| 2015/0179848 A1* | 6/2015 | Korman | H02S 20/24 136/245 |

FOREIGN PATENT DOCUMENTS

| | | | | |
|---|---|---|---|---|
| DE | 20 2010 015817 U1 | 2/2011 | | |
| DE | 102010042819 A1 * | 12/2011 | ............. | F24J 2/5233 |
| DE | 102011055819 A1 * | 5/2013 | ............. | F24J 2/5235 |
| DE | 202013002162 | 6/2013 | | |
| DE | 102012105072 B3 * | 11/2013 | ............. | F24J 2/5233 |
| DE | 10 2012 221894 A1 | 6/2014 | | |
| EP | 2 378 565 A1 | 10/2011 | | |
| WO | 2012/116121 A1 | 8/2012 | | |
| WO | WO 2013125391 A1 * | 8/2013 | ............. | F24J 2/5211 |

OTHER PUBLICATIONS

PanelClaw "Kodiak Bear Flat Roof Mounting System", http://www.panelclaw.com/component/k2/item/41.html?Itemid=186, pp. 1-2, retrieved May 6, 2014.

Civicsolar "PanelClaw Polar Bear East/West Roof Mount System", http://www.civicsolar.com/product/panelclaw-polar-bear-eastwest-roof-mount-system, pp. 1-2, retrieved Oct. 22, 2014.

Mounting Systems "Flat roof solar mounting system Lambda Light EW+", http://ww3.mounting-systems.info/en/flat_roof_mounting_system_lambda_light_EW.html, p. 1, retrieved Oct. 22, 2014.

Altec "Optimised flat roof ballast system", http://altec-solar.co.uk/products/mountingsystems/flatroofsystems/optimisedballast/, p. 1, retrieved Oct. 22, 2014.

Tritec "New, Extremely Efficient Mounting System: Tri-Flat", http://www.tritec-energy.com/en/tritec/news-info-13.09.2013-01/, pp. 1-4, retrieved Oct. 22, 2014.

Morganssolar "4.0kWp East/West", http://morganssolar.com/case-studies-2/4-0kwp-east-west-array/, pp. 1-3, retrieved Oct. 22, 2014.

Renusol Solar Mounting Systems "Best for East/West", http://www.bestforeastwest.de/, pp. 1-2, retrieved Oct. 22, 2014.

Spider-Rax "Tarantula Ballasted Flat Roof Mounting", http://spider-rax.com/Tarantula_final.pdf, pp. 1-2, retrieved Oct. 22, 2014.

(56) References Cited

OTHER PUBLICATIONS

International Search Report mailed on Nov. 6, 2015 for International Patent Application No. PCT/US2015/046411, 5 pages.
Written Opinion mailed on Nov. 6, 2015 for International Patent Application No. PCT/US2015/046411, 7 pages.

* cited by examiner

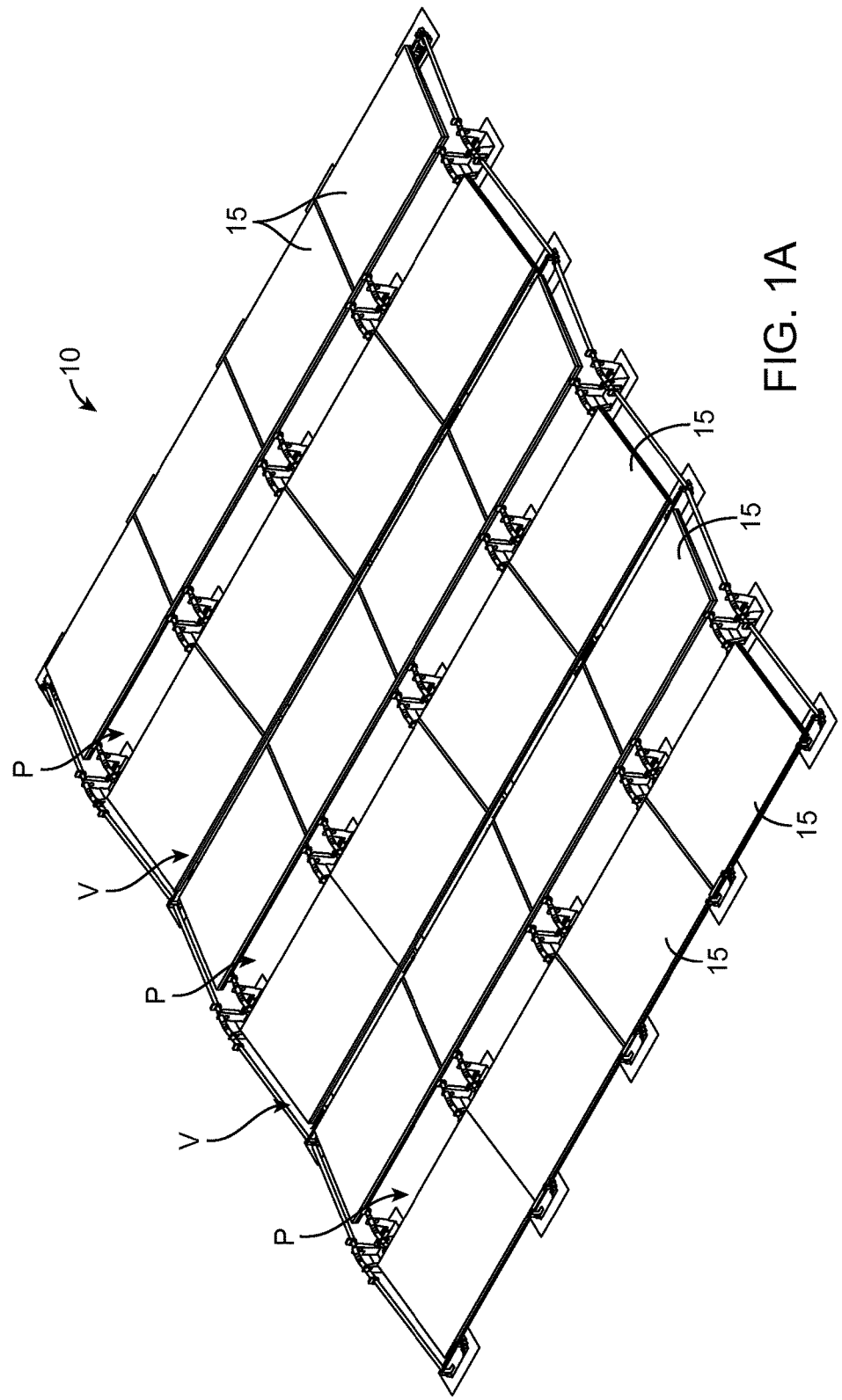

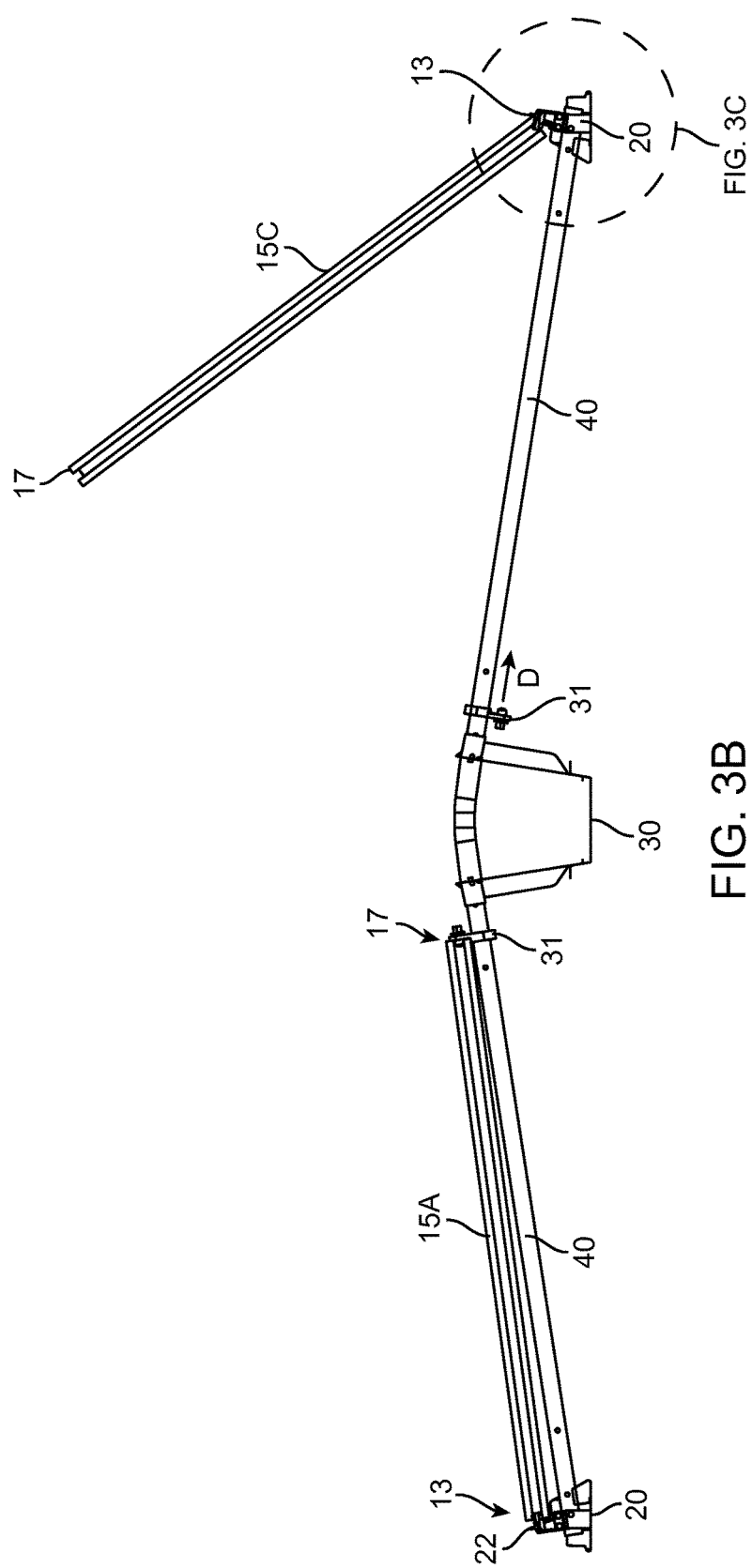

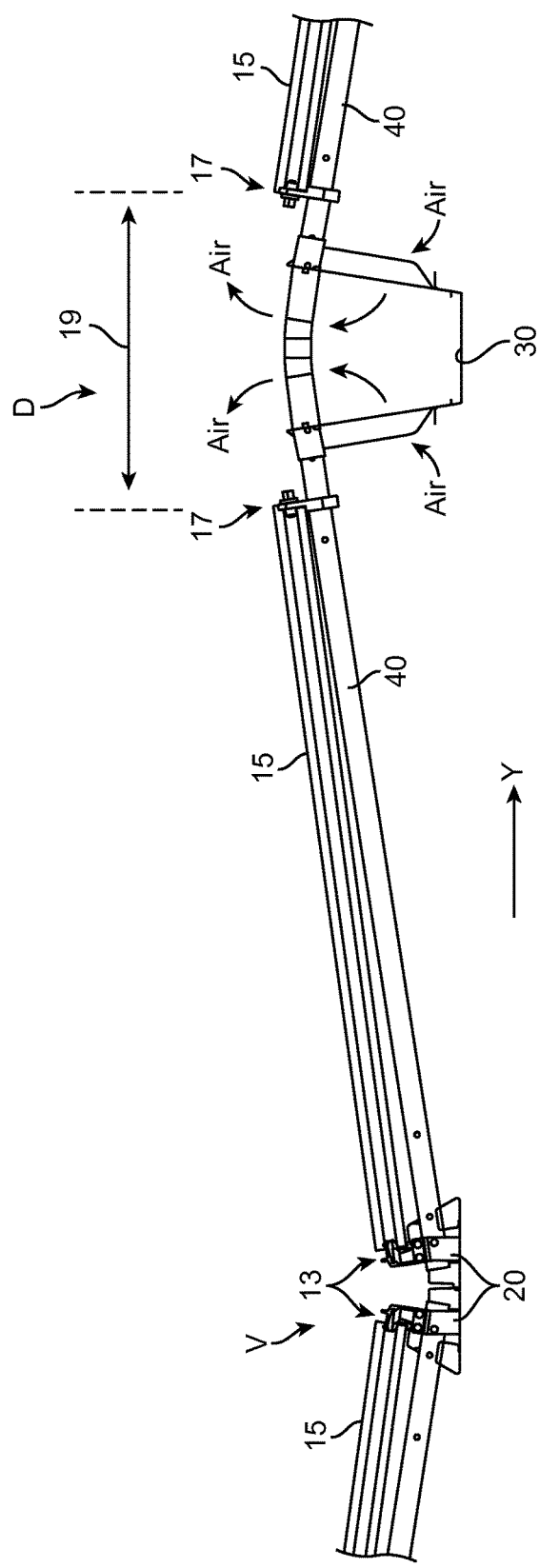

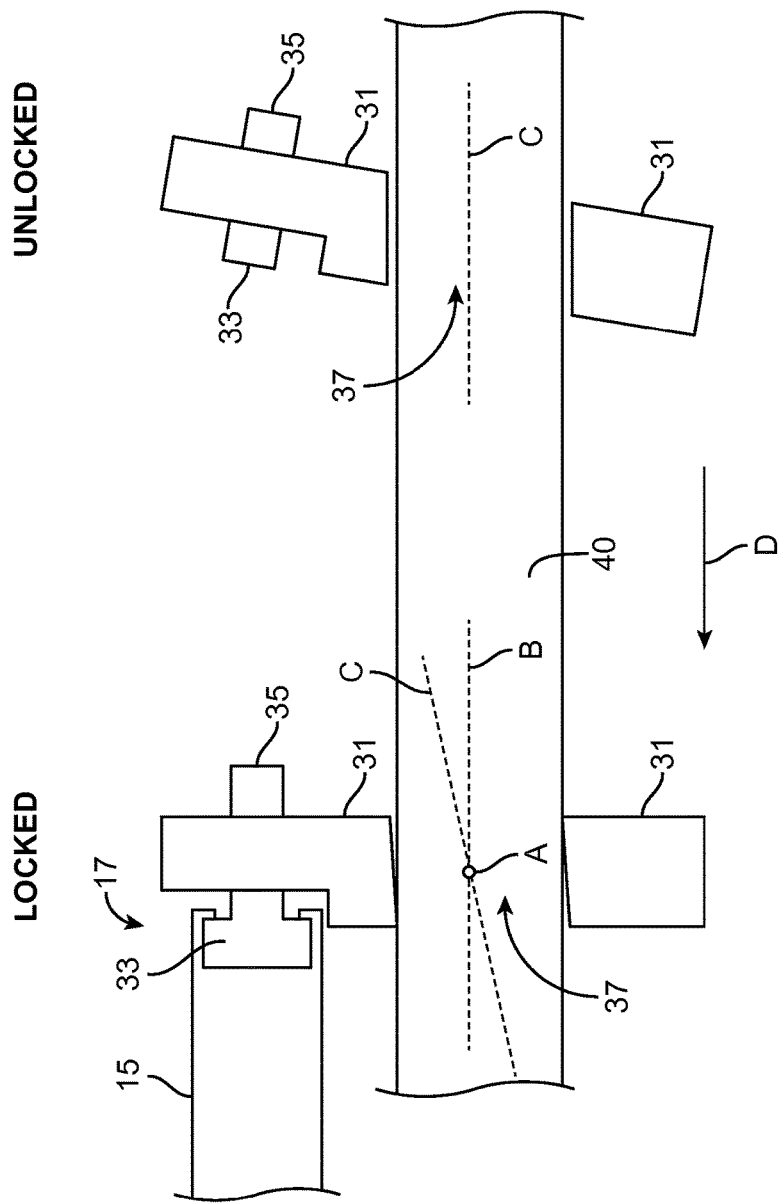

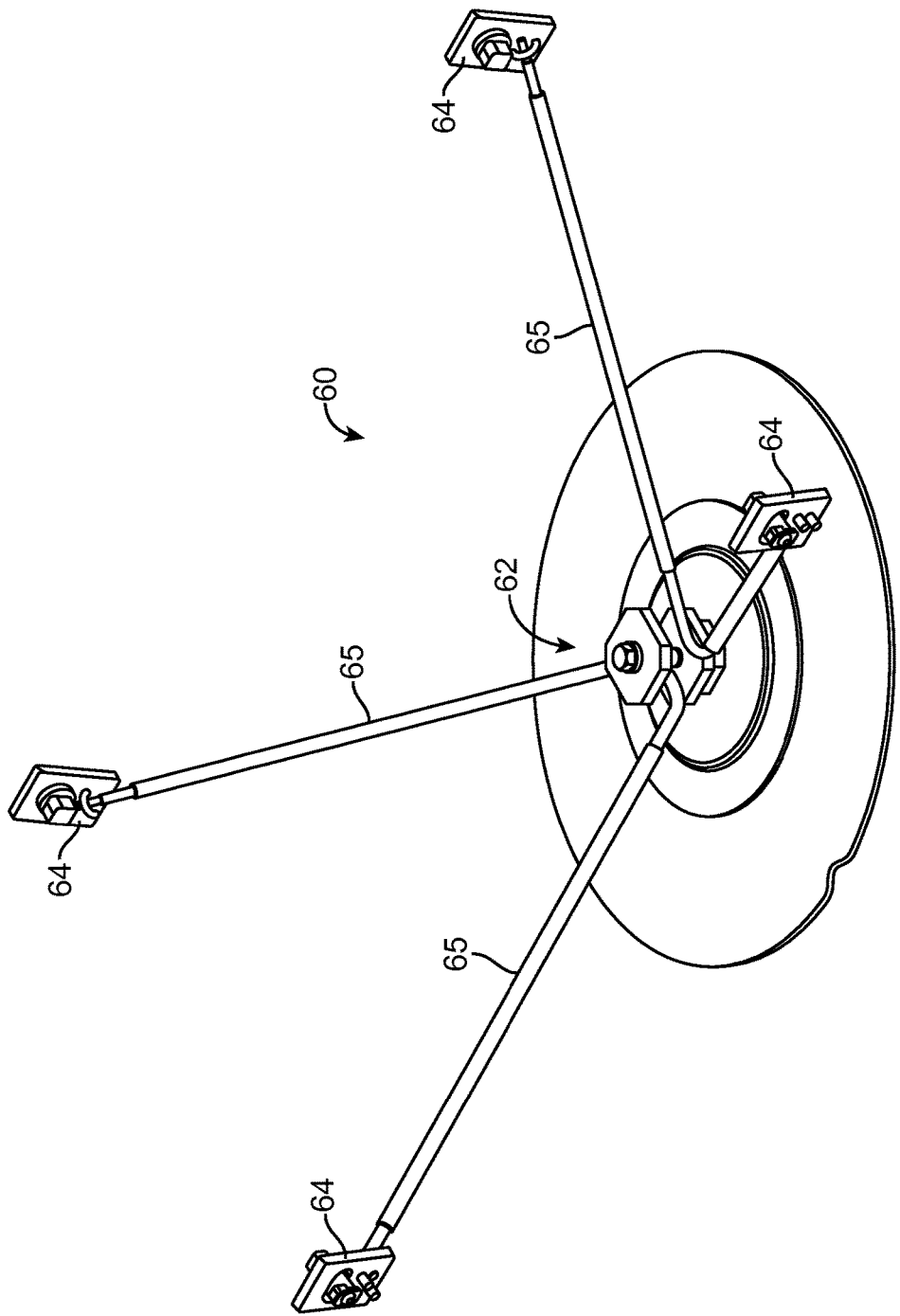

EAST-WEST PHOTOVOLTAIC ARRAY WITH SPACED APART PHOTOVOLTAIC MODULES FOR IMPROVED AERODYNAMIC EFFICIENCY

RELATED APPLICATION

The present application claims priority to U.S. Provisional Patent Application Ser. No. 62/040,664, of same title, filed Aug. 22, 2014.

TECHNICAL FIELD

The present invention relates to east-west photovoltaic module arrays.

BACKGROUND OF THE INVENTION

Traditionally, solar modules have been mounted onto buildings with the modules angled to the south (when in the Northern Hemisphere). Lately, however, solar arrays have also been built with their photovoltaic modules angled in alternating rows facing to the east and west. In these "east-west" systems, the module rows are thus laid out with the array having alternating peaks and valleys (formed where the upper and lower sides of the angled modules meet one another). Surprisingly, such east-west arrays may actually generate more power over the course of the day, and also typically generate such power at more convenient times during the day. Specifically, such east-west systems lengthen power production time and eliminate traditional mid-day power spikes.

When wind passes over arrays configured with alternating peaks and valleys, low pressures are generated above the array, thereby causing lift forces on the array. Adding excessive ballast to the roof is inconvenient since the ballast must be both lifted up onto the roof and then moved around by the installers. In addition, rooftops also have weight limitations. Alternatively, fastening east-west systems directly to the roof has the disadvantage of causing roof penetrations which are expensive and potentially compromise roof integrity. Also, roofs have a maximum safe load which can limit the amount of photovoltaics used on the roof.

What is instead desired is an east-west system with improved aerodynamics (i.e.: one that generates less lift when wind passes thereover) such that excessive ballasting is not required. Preferably, such a system would also be lightweight, flexible, and fast and easy to assemble, making it easy for installers to assemble it on the roof. In addition, such a system would ideally be designed to accommodate thermal expansion and contraction of the panels themselves. In addition, such a system would ideally be designed to simplify grounding of the modules. Preferably, the system would also balance stiffness in order to get load sharing between components during wind events, yet also not be too stiff in order to accommodate roof pitch changes and mange thermal strains. To date, such a system has not been realized. As will be shown below, the present design provides such a desired system.

SUMMARY OF THE INVENTION

The present invention provides a solar array having successive rows of photovoltaic modules angled in opposing directions. As a result, a first row of photovoltaic modules are tilted (angled) to the east, a second row of photovoltaic modules are tilted (angled) to the west, a third row of photovoltaic modules are tilted (angled) to the east, etc. This tilted (angled) pattern is repeated from east to west across the array, forming alternating "peaks" and "valleys" between the module rows across the array. Lower sides of the photovoltaic modules are preferably supported by pivot mounts on lower mounting bases. Upper sides of the photovoltaic modules are preferably supported by slidable supports moveable on the bars connecting the lower mounting bases to upper mounting bases.

In one preferred embodiment, the present invention provides a photovoltaic mounting system, comprising: (a) an upper mounting base; (b) a lower mounting base; (c) a photovoltaic module support on the lower mounting base, the photovoltaic module support including a connector dimensioned to connect onto a lower side edge of a photovoltaic module; (d) a bar extending from the lower mounting base to the upper mounting base; and (e) a sliding support positionable along the bar, wherein the sliding support includes a connector dimensioned to connect onto an upper side edge of the photovoltaic module.

Preferably, the bars are positioned non-horizontally and the sliding support pivot locks onto the bar (by rotation about an axis perpendicular to the longitudinal axis of the bar and parallel to the upper side edge of the module) when the sliding support is secured to an upper side edge of the photovoltaic module. In preferred embodiments, the solar module upper supports are slidable connectors that slide along the bars such that the lower ends of the photovoltaic modules are pivot locked downwardly into the solar module lower supports prior to the solar module upper supports being slid downwardly along the bars and connected onto the upper sides of the photovoltaic modules.

In other preferred embodiments, the present invention provides a photovoltaic array, comprising: (a) a plurality of photovoltaic modules; and (b) mounting hardware supporting the plurality of photovoltaic modules such that the photovoltaic modules are positioned in an array with successive rows of the photovoltaic modules being angled in opposing directions, wherein: (i) upper side edges of adjacent photovoltaic modules are spaced apart a distance of between 18 to 50% of the width of a photovoltaic module; and (ii) lower side edges of adjacent photovoltaic modules are spaced apart a distance of less than 20% of the width of a photovoltaic module.

As such, the gaps formed between successive rows of photovoltaic modules follow a novel pattern. Simply put, the gaps between the "valleys" (i.e.: between the lower side edges of successive module rows) are close together, while the gaps between the "peaks" (i.e.: between the upper side edges of successive module rows) are far apart. As will be explained, this novel spacing between module rows offers many advantages by balancing the considerations of aerodynamics, installer efficiency, rooftop power density, and overall system weight.

For example, advantages of the present design include the fact that the modules can be quickly dropped into position and do not require an aisle or access way running along the lower sides of the module rows for an installer to fasten the modules into an array structure. Instead, the modules are simply pivot-locked by an installer working between the upper side edges of the successive rows. The installer simply lowers the upper sides of the modules (often with one hand) after the lower side of the module has first been placed onto the lower module supports on the lower mounting base. Next, the installer quickly secures each module by sliding the upper connectors down along the non-horizontal bars (connecting the upper and lower mounting bases) to a position against the upper sides of the modules. Stated another way, the installer simply stands in the gap at the "peaks" between the module rows, and does not need to access the gaps in the "valleys" between the module rows.

An important advantage of preferred spacing or "gap" between the "peaks" (i.e.: upper side edges of successive adjacent module rows) is that the upper sides of the modules in the rows are spaced apart a distance large enough to minimize wind lift effects. This is done by providing a passageway for higher pressure air to escape up between the modules. As stated above, another advantage of the preferred gap at the peaks between the upper sides of the modules is that it provides a place for the installer to stand when assembling the array. Yet another advantage of the upper sides of the modules being spaced apart is that it is possible to remove any panel from the array without disturbing the other assembled panels in the array. Conversely, another advantage of the present system is that the bottom sides of the photovoltaic modules can actually be positioned quite close to one another (since the installer need not stand at this location). This can be done by securing pairs of lower bases together, which both provides stability to the array, grounding from one module row to another and also increases the total area of the array that is covered by the photovoltaic modules.

In other preferred aspects, the present invention provides a photovoltaic mounting system, comprising: (a) an upper mounting base; (b) a lower mounting base; (c) a bar extending between the upper mounting base and the lower mounting base; and (d) a snap-fit connector on each of the opposite ends of the bar, the snap-fit connectors securing the opposite ends of the bar to the upper and lower mounting bases. These snap-fit connectors both ground the upper and lower mounting bases to one another while permitting the array to flex considerably if the bars are rotated about their longitudinal axes (for example, during wind events, thermal expansion or contraction, or simply during the assembly of the array itself over an uneven roof surface).

Another advantage of the present system is that it is well adapted to deal with the effects of thermal expansion and contraction of the modules. This is due to the fact that the modules do not touch each other at their sides. Thus, they can expand and contract in two perpendicular directions without contacting one another. Moreover, both the upper and lower mounting bases have supports thereon that permit side-to-side sliding motion of the modules mounted thereon. Additionally, perpendicular lengthwise motion (i.e.: between the peaks and valleys of the array) can be accommodated through flexing of the upper supports on the non-horizontal bars and the lower supports on the lower mounting bases.

Additional advantages of the present system include the fact that it is very quick and easy to install using a very minimal amount of non-standard hardware. As stated above, in preferred embodiments, various components can be quickly snap fit directly into one another. The present system is also lightweight, and can be shipped in small volume containers. Nevertheless, it provides a solid structural base for an array of photovoltaic modules to be built.

One more advantage of the present system is that its non-horizontal bars that span between the upper and lower mounting bases provide moment resistance during the pivot locking installation process. Also, the pivot locking mechanisms and connectors are attached directly to each module frame so that each individual module is electrically grounded right at the time of its attachment into the array.

BRIEF DESCRIPTION OF THE DRAWINGS

FIG. 1A is a perspective view of a solar module array in accordance with the present invention.

FIG. 3B is a side elevation view corresponding to FIG. 1, also showing the start of pivot installation of one of the photovoltaic modules.

FIG. 4 is a side elevation view of a larger section of the solar module array in accordance with the present invention, showing pairs of lower mounting bases connected together, and showing the spacing or "gaps" between the "peaks" and "valleys" (i.e.: upper and lower sides of the photovoltaic module rows) across the array.

FIG. 6C is a sectional elevation view corresponding to FIG. 6A, showing the sliding support pivoted from an unlocked to a locked position.

FIG. 9A is a perspective view of a first positive attachment system.

DETAILED DESCRIPTION OF THE DRAWINGS

FIG. 1A is a perspective view of a photovoltaic solar module array 10 having photovoltaic modules 15 positioned and supported in accordance with the present invention. As can be seen, successive rows of the photovoltaic modules 15 are tilted or angled in opposing directions such that the array 10 forms alternating "peaks" P and "valleys" V. As can be seen, and as will be fully explained herein, the gaps between the modules rows are preferably large at the peaks P and the gaps between the module rows are preferably small at the valleys V.

Figure 1B:
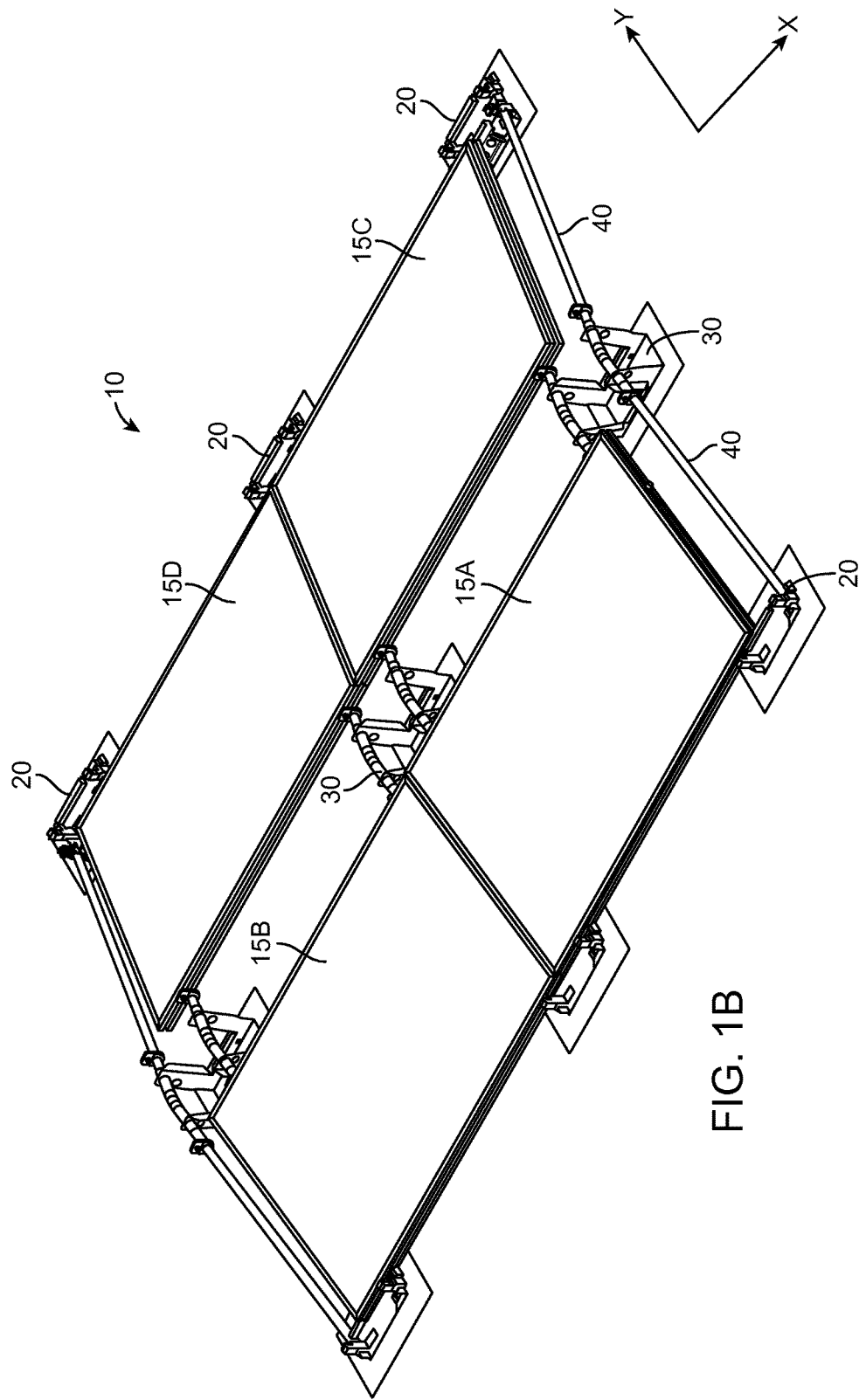
FIG. 1B is a perspective view of a close-up section of a solar module array in accordance with the present invention, showing only four photovoltaic modules with a center row of upper mounting bases and two rows of lower mounting bases.

FIG. 1B is a perspective view of a section of photovoltaic array 10 showing only four photovoltaic modules. As illustrated, four photovoltaic modules 15A, 15B, 15C and 15D are supported between one row of upper mounting bases 30 and two rows of lower mounting bases 20. As can also be seen, a first row of modules 15A and 15B are tilted at an angle in a first direction whereas a second row of modules 15C and 15D are tilted at the same angle in an opposite direction. It is to be understood that additional modules and bases may be added to the ends of either of these two module rows (to extend the rows in the X direction), or to the sides of either of these two module rows (to extend the array with successive rows in the Y direction). This module orientation is commonly known as an "east-west" system mounting, for example with modules 15A and 15B tilted to face east and modules 15C and 15D being tilted to face west.

Figure 2:
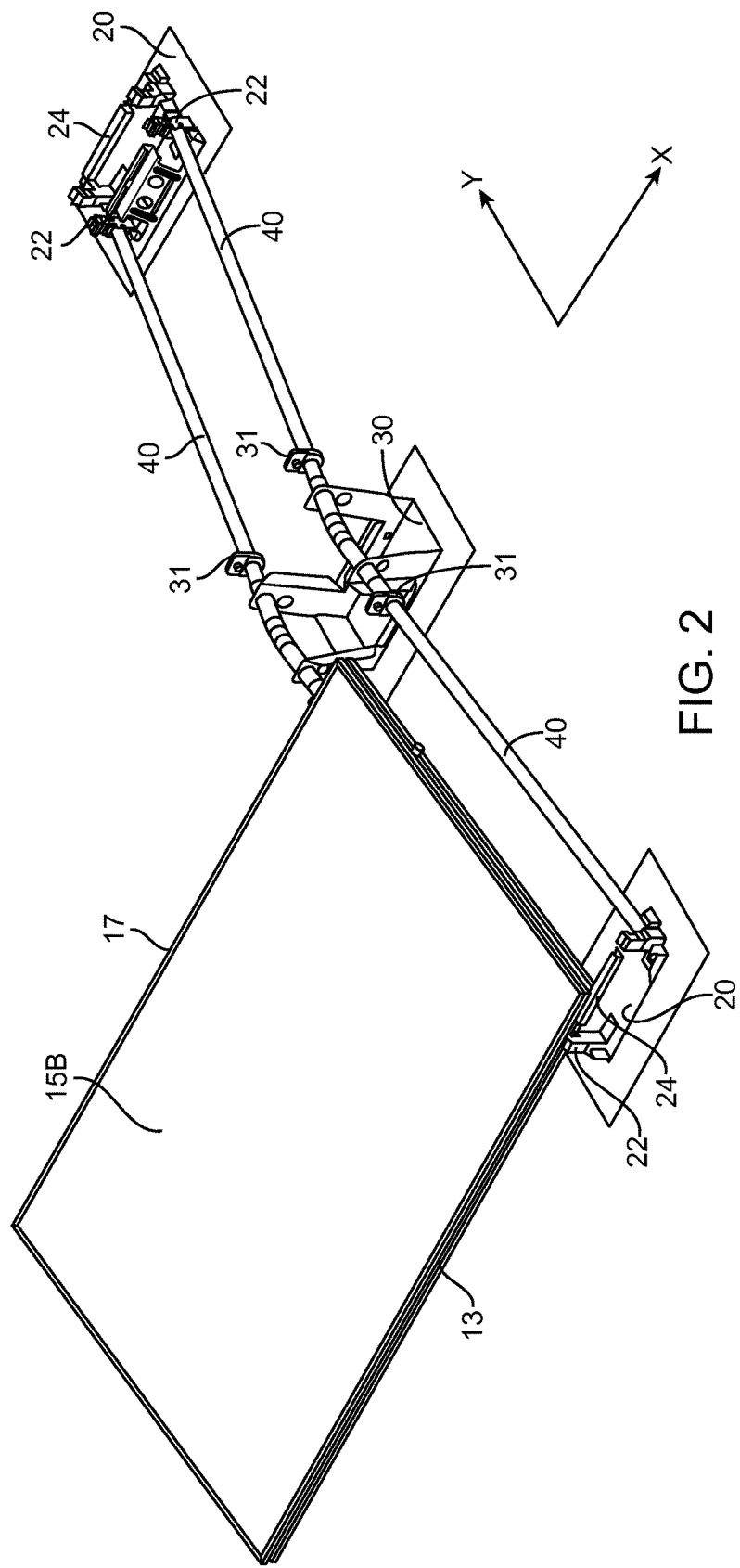
FIG. 2 is a close-up perspective view of the structure linking each upper mounting base to a lower mounting base on either side.

FIG. 2 is a further close-up perspective view of one embodiment of the mechanical structure that links each upper mounting base 30 to a lower mounting base 20 on either side. Specifically, a pair of bars 40 are provided with each bar 40 extending at a (preferably) non-horizontal angle from one of the upper mounting bases 30 to one of the lower mounting bases 20, as shown. Four bars 40 are positioned spanning from one shared upper mounting base 30 to a pair of lower mounting bases 20. For ease of illustration, only one photovoltaic module 15B is shown. Bars 40 are preferably provided in pairs (as shown) such that a side edge of one photovoltaic module can be mounted above each bar 40 (with a top corner of the module supported by one of the upper module supports 31 and a bottom corner of the module held by one of the lower module supports 22).

As seen best in FIGS. 1B and 2, a pair of parallel bars 40 (and a single upper and lower base 30 and 20) can be used to support the corners of two different photovoltaic modules 15A and 15B. However, the present invention is not so limited. For example, a single photovoltaic module 15 may instead be supported to span across both pairs of bars 40.

Figure 6A:
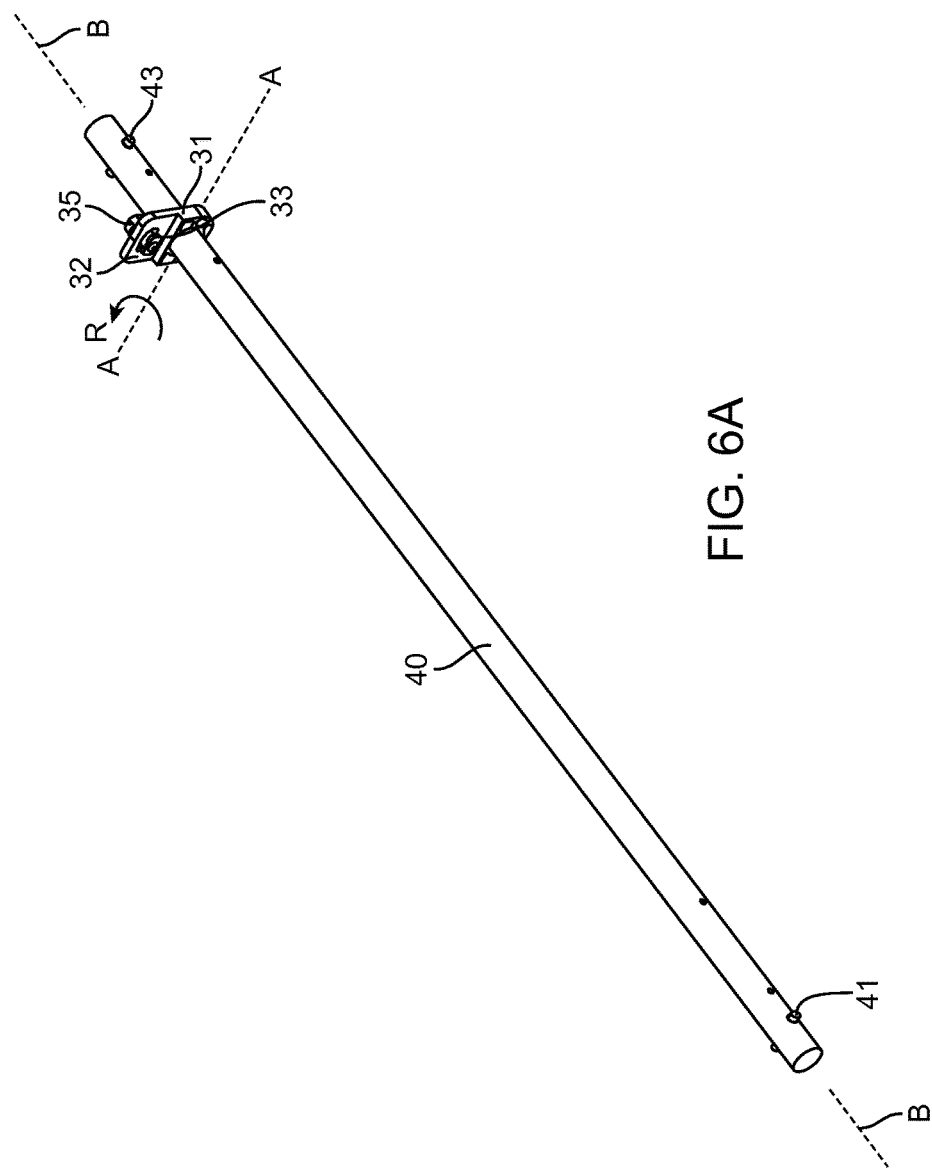
FIG. 6A is a perspective view of one of the bars that extends from an upper mounting base to a lower mounting base showing an upper module positioned to slide therealong.
Figure 6B:
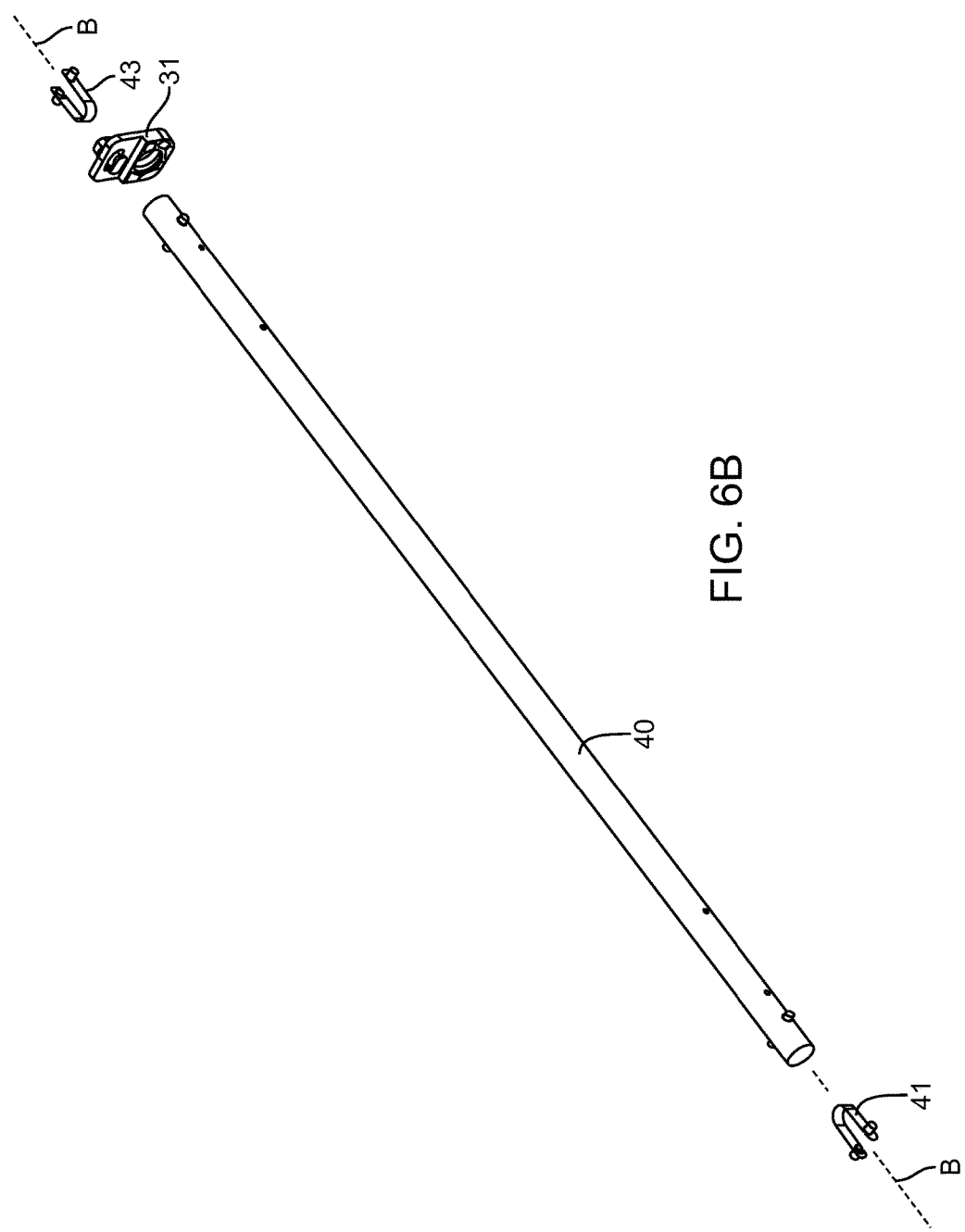
FIG. 6B is an exploded perspective view corresponding to FIG. 6A.
Figure 6D:
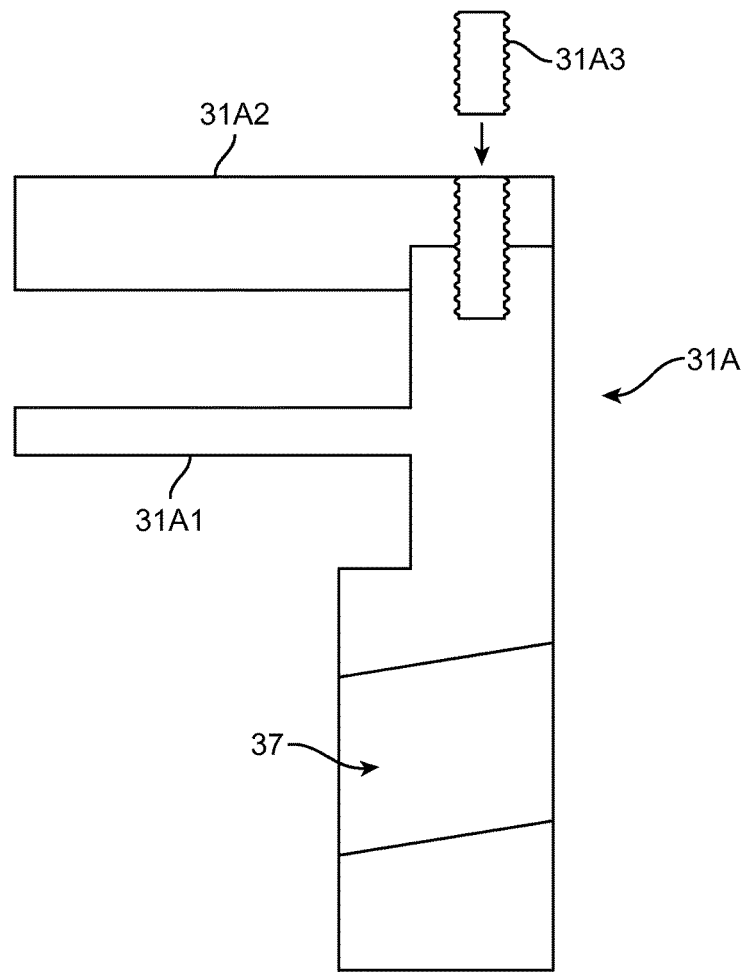
FIG. 6D is an exploded sectional view of a wraparound sliding support.

FIGS. 3A to 3D are views corresponding to FIG. 1, showing a preferred method of pivot installation of one of the photovoltaic modules 15C, as follows. First, an installer places the lower side 13 of module 15C onto one of the lower module supports 22. Preferably, the lower sides 13 of the photovoltaic modules are dimensioned to be pivot locked downwardly into the lower module supports 22. In one exemplary embodiment, photovoltaic module 15C has optional grooves on both its upper and lower sides, 17 and 13 respectively. Such grooves may be a "Zep®-style" groove (made by Zep Solar, LLC of San Rafael, Calif.) extending continuously around the four sides of the photovoltaic module, for example as seen in Applicants' published U.S. Patent Application No. 2011/0000526, incorporated herein by reference in its entirety. However, it is to be understood that the present system can also be used with modules that have no grooves on their frames, or even modules with grooves extending only partially there around. In groove-less frame systems, the lower module supports 22 may instead simply be fastened onto or around the lower sides 13 of the photovoltaic modules, and the sliding supports 31 may be positioned around the upper sides 17 of the modules (as seen in FIG. 6D). Alternatively, the groove could be within the base components which the frame could insert into.

Figure 3A:
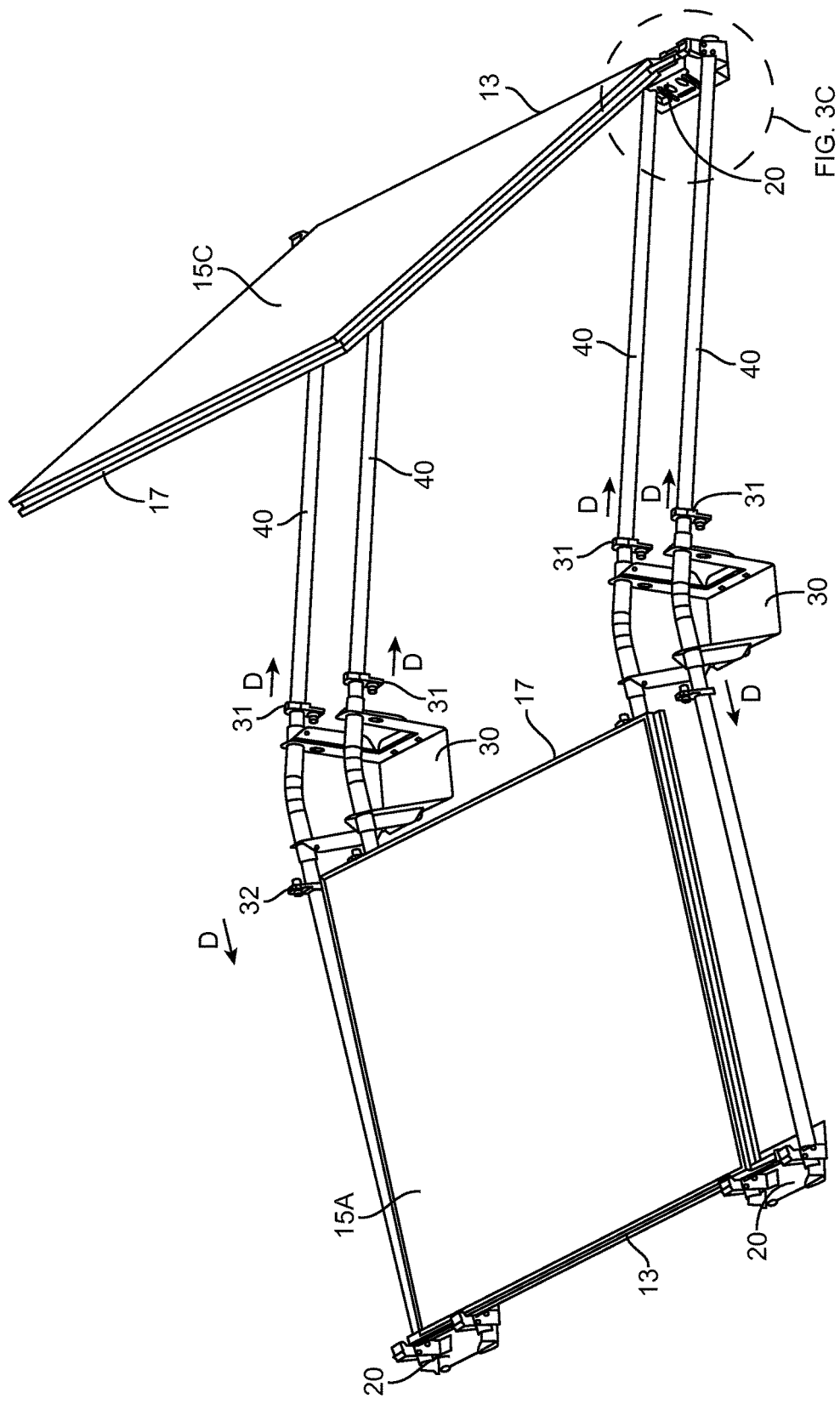
FIG. 3A is a perspective view corresponding to FIG. 1, showing the start of pivot installation of one of the photovoltaic modules.
Figure 3C:
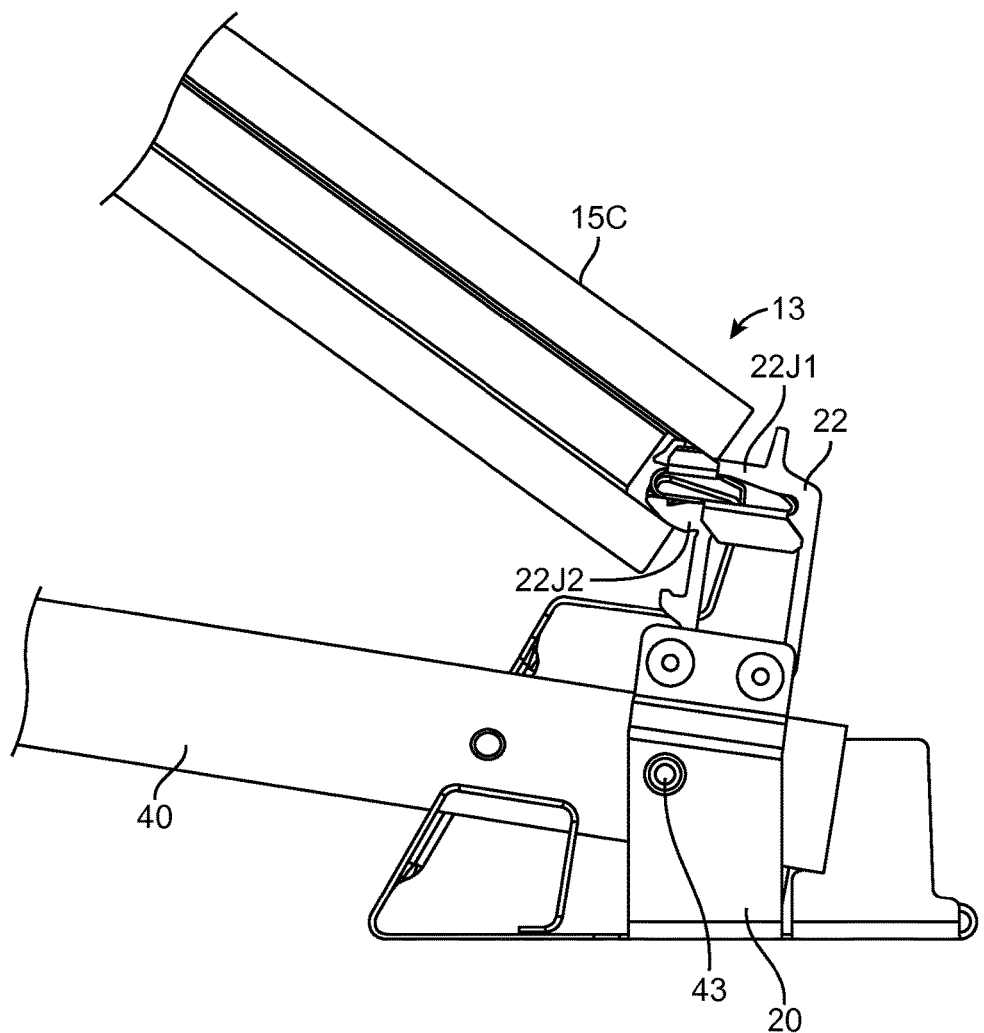
FIG. 3C is a close-up detailed view corresponding to a portion of the system in FIG. 3A, prior to the pivot-locking of the module onto a lower support.
Figure 3D:
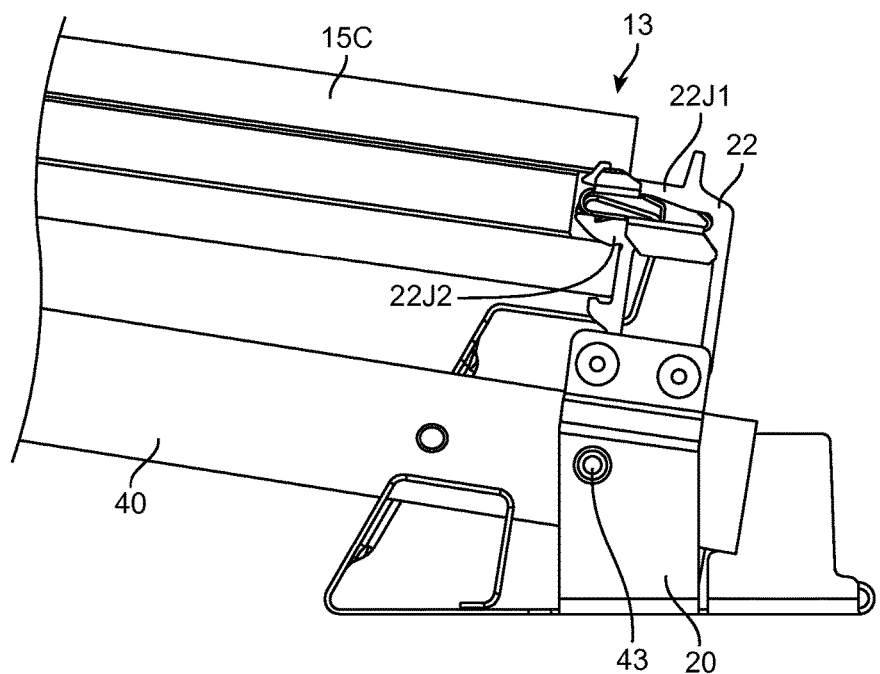
FIG. 3D corresponds to FIG. 3C, after the module has been pivot-locked down onto the support.

Referring to FIGS. 3B and 3C, the photovoltaic module 15C is about to be pivoted downwardly into its final installed position (e.g.: as shown in FIG. 3D). After module 15C has been pivoted downwardly into position, sliding supports 31 are then slid down along bars 40 (in direction D) to a position such that they can be connected onto the upper side 17 of the module. Prior to this, the module 15C can be set down on top of bars 40, and even slid down along bars 40 to its final position prior to bring pivot-locked into place. Preferably, sliding support 31 may be connected into an optional groove running along the top side 17 of the photovoltaic module, as shown. In the absence of a top groove in the module, sliding supports 31 may instead be connected into or onto the upper side 17 of the photovoltaic modules using any other method, including but not limited to, wraparound connectors. (Further details of sliding supports 31 are shown in FIGS. 6A, 6B and 6C, and further details of wraparound connectors 31A are shown in FIG. 6D, fully described below).

FIGS. 3C and 3D show sequential close-up views of module 15C being pivot-locked onto a lower module support 22. Specifically, lower module support 22 is inserted into the groove in the lower side 13 of the module frame. As the module is dropped into position by the installer, the lower module support 22 locks into the groove. An example of the geometry and operation of lower module support 22 is seen in the upper ends of leveling foot 110 seen in FIGS. 1 to 8 of U.S. Published Patent Application 2014/0175244, the disclosure of which is incorporated herein by reference in its entirety for all purposes. (For example, the upper and lower jaws 22J1 and 22J2 of lower module support 22 are slightly compressed together when inserted into the groove in lower side 13 after module 15 has been dropped down into its pivot-installed position.

The advantage of bars 40 are that they counter the moment when photovoltaic modules 15 are pivoted down into their final pivot-locked installed position. Specifically, having bars 40 prevents excess torque from being applied to lower mounting bases 20 (and especially their attached lower module supports 22) when the lower sides 13 of photovoltaic modules 15 are each pivot locked onto their bottom support 22.

Next, as seen in FIG. 4, pairs of lower mounting bases 20 can be attached together (such that photovoltaic array 10 can be extended in the Y direction). When extended in the Y direction, array 10 will form successive adjacent rows of "peaks" P and "valleys" V of photovoltaic modules 15 angled or tilted in alternating directions. For example, in this illustrated embodiment, each row is tilted or angled from the horizontal by the same amount, but in an opposite direction. However, it is to be understood that the present invention is not so limited, and that different rows of photovoltaic modules may be tilted by different degrees in different directions, as desired.

Having two lower mounting bases 20 share a single upper mounting base 30 and having the lower mounting bases 20 fastened together in pairs (as illustrated) also makes it easy to lay out the present system 10 on the roof Specifically, after the first lower mounting base 20 and upper mounting base 30 are positioned on the roof, then the rest of the array falls quickly into position during installation. All that is required when starting such an installation is that parallel rows of bases 20 and 30 are correctly spaced apart.

FIG. 4 also shows the preferred spacing or "gap" between the upper and lower sides 17 and 13 of photovoltaic modules 15 in the peaks P and valleys V across the array. In preferred embodiments, peaks P (i.e.: the upper sides 17 of each of adjacent modules 15) are spaced apart from one another to form a gap 19 at the upper mounting base 30. In preferred embodiments, the width of gap 19 is between 18% and 50% of the width each of the modules (Note: the "width" of the modules is the distance between lower side 13 and upper side 17 of any module 15). Preferably, the modules 15 all have the same dimensions. In more preferred embodiments, the width of gap 19 at array peak P is 20% to 45%, or from 30% to 40% of the width of each of the modules. As such, with standard modules, gap distance 19 is preferably 50 mm to 500 mm.

The inventors have determined that the preferred dimensions of peak gap 19 offer unexpected and beneficial aerodynamic performance advantages to the present system. Specifically, having the upper sides 17 of modules 15A and 15C spaced apart by this preferred gap distance 19 improves aerodynamics by reducing lift on the system as wind passes thereover. This is due to the fact that peak gap 19 permits higher pressure air (which is underneath the array) to escape upwardly through gaps 19 as wind passes over the surface of the array. Upward movement of air is shown by arrows labelled "Air". Reducing wind lift has the added benefit of reducing ballasting requirements. Thus, by reducing lift, the present spacing reduces the amount of ballast material that can be needed on top of the roof. In addition, the present inventors have experimentally determined that using the present system, it is possible to build an array with a weight of less than 3 psf (of which approximately 2.4 psf are attributed to the modules themselves). Thus, the present design provides a lightweight solution. Moreover, by reducing lift, the present system also reduces the need to anchoring penetrations being made into the roof. Simply put, the present inventors have experimentally determined that the size of peak gap 19 provides an excellent balance of aerodynamic efficiency and access for installers, roofers, etc. on one hand, but without making the gap so large that excessive working surface area of the array is lost (so that energy production would be unnecessarily decreased).

Another benefit of a large peak gap 19 (i.e.: the distance between upper sides 17 of the adjacent modules 15A and 15C) is that an installer can actually stand within peak gap 19 when installing the modules. This gives the installer a convenient place to stand while lowering (i.e.: downwardly pivoting) the modules into their final positions (as illustrated in sequential FIGS. 3C and 3D). Moreover, since peak gaps 19 extend along in rows between the upper sides 17 of modules 15, the installer can return to the array after its completion and remove any one of the modules without disturbing any of the surrounding modules. Moreover, there is never any need for the installer to walk directly on the surface of any of modules 15 when doing this work. Lastly, access of the installer's hands through peak gaps 19 also assists in wire management (i.e.: connecting various wires to the modules) during system assembly.

Preferably, the gap distance at the valleys V (i.e.: between adjacent lower sides 13 of adjacent module rows) is less than 20% of the width of a photovoltaic module. As such, with standard modules, gap distance of less than 150 mm. The advantage of minimizing this gap distance is that it increases the density of the photovoltaic modules on the roof. Simply put, having the photovoltaic modules positioned close together at their lower ends 13 increases the amount of the roof surface that is covered by the photovoltaic modules, thereby increasing power generation.

Figure 5A:
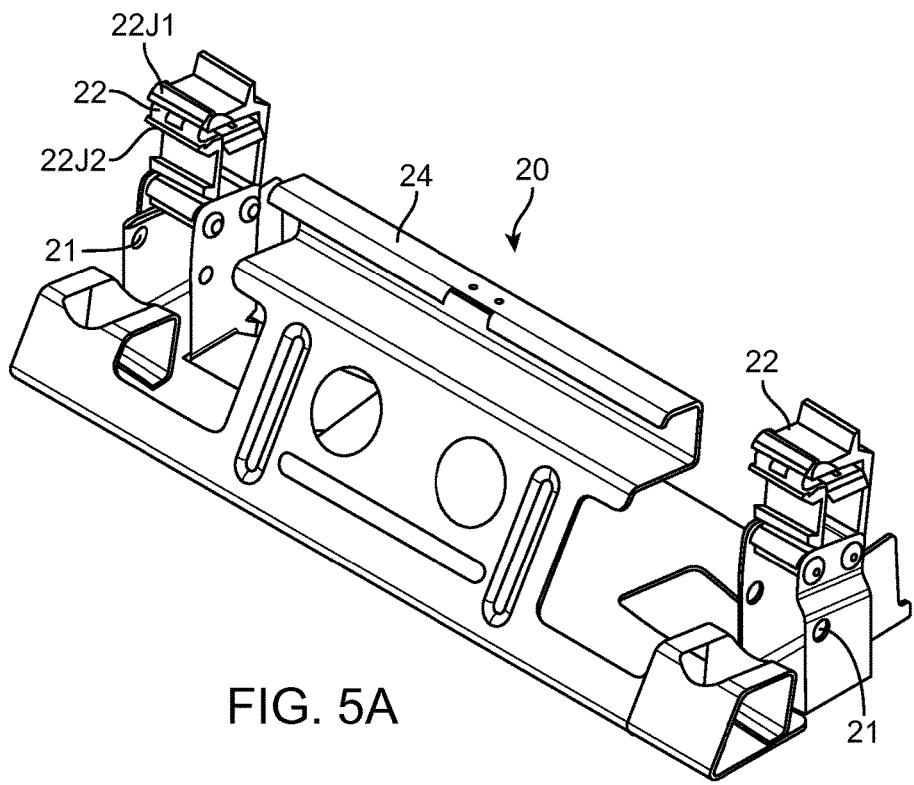
FIG. 5A is a front perspective view of one of the lower mounting bases.
Figure 5B:
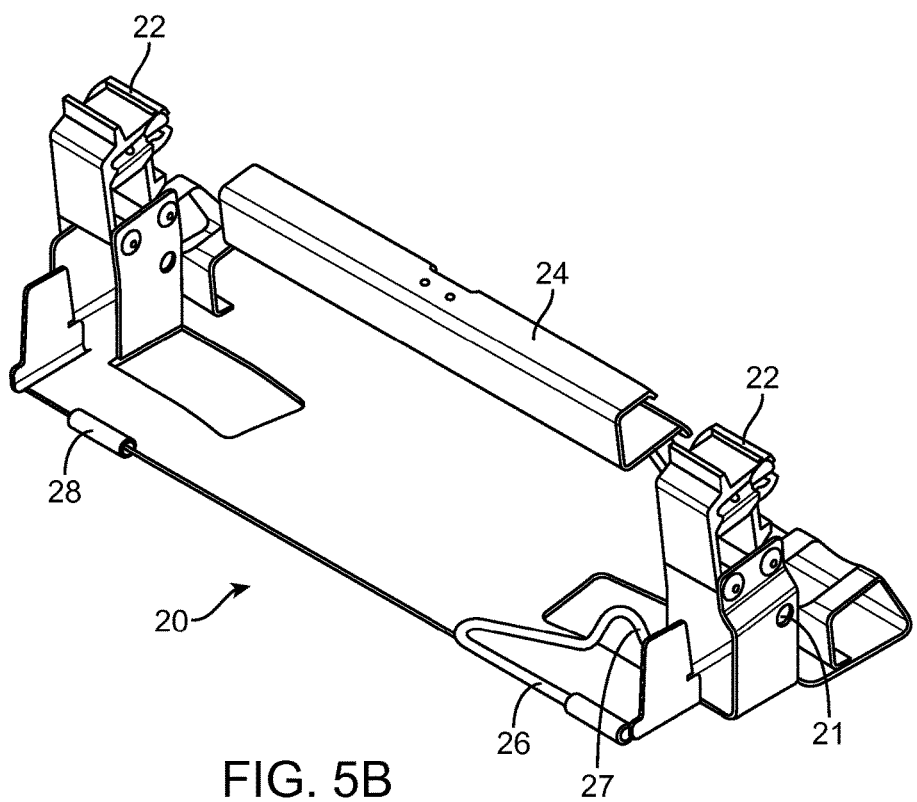
FIG. 5B is a rear perspective view of one of the lower mounting bases.
Figure 5C:
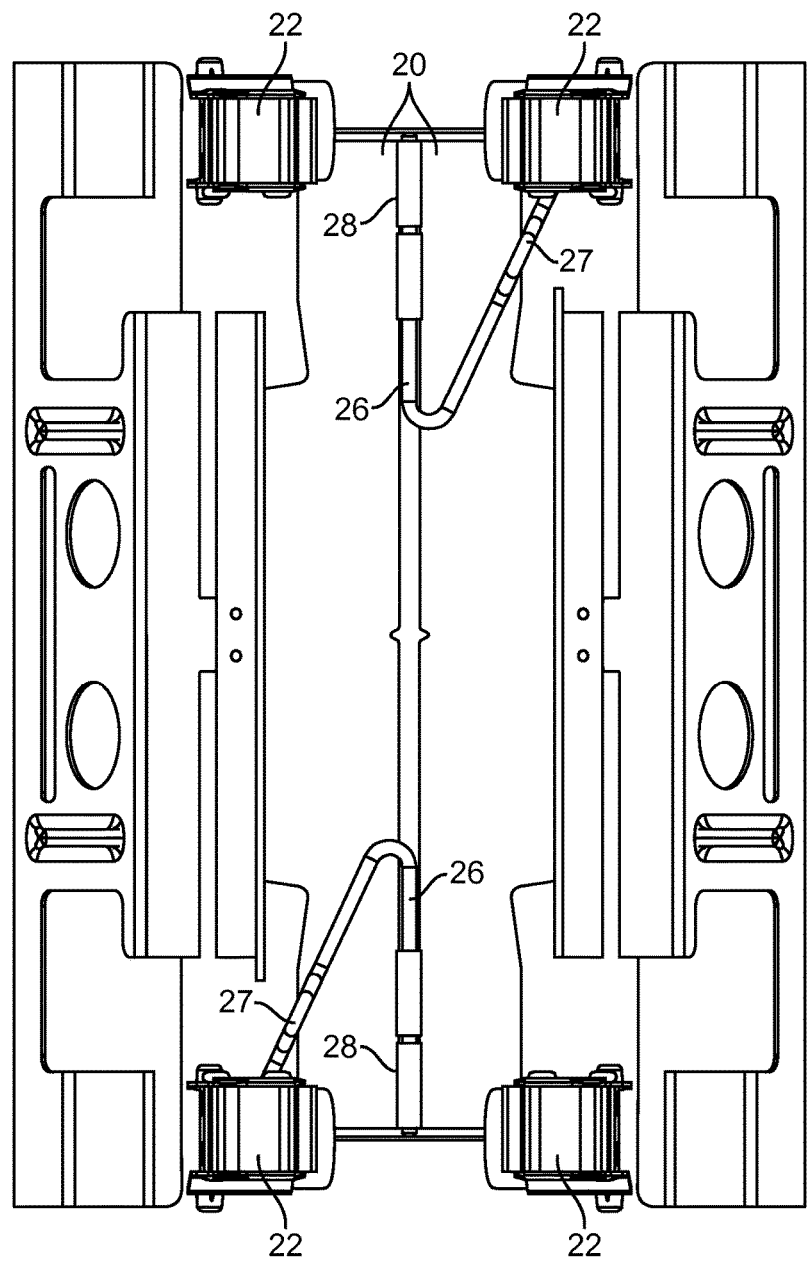
FIG. 5C shows a top plan view of two lower mounting bases connected together, facing in opposite directions.

As further illustrated in FIGS. 5A and 5B, each lower mounting base 20 has a lower module support 22 connected thereto. (Alternatively, lower module support 22 may instead be connected to a lower end of bars 40, all keeping within the scope of the present invention). Lower module supports 22 are each dimensioned to connect to a lower side 13 of a photovoltaic module to support the lower side of the photovoltaic module. Thus, lower module supports 22 are found at the valleys V of the array (FIG. 4).

FIGS. 5A and 5B show additional optional features of the present system in more detail. For example, optional bottom alignment flange 24 can be provided. Bottom alignment flange 24 is preferably dimensioned to align the bottom corners of two photovoltaic modules (most preferably by being received in a lower side groove of the module frames). As a result, lower module supports 22 and bottom alignment flange 24 can all be inserted into the same groove on lower side 13. Alternatively, bottom alignment flange 24 can be a wraparound support (e.g.: passing over the top edge and under the bottom edge of the module, keeping within the scope of the present invention).

Also provided is a spring connector 26 which can be slid and rotated to lock such that its end 27 can be inserted into tube 28 on another lower mounting base 20. As such, two bases 20 can be placed together facing in opposite directions with the spring connector 26 on each one of them being moved to fasten into the tube 28 on the other base. This connection is seen in the top plan view of FIG. 5C. This locks the two bases 20 together (as also seen in FIG. 4). Advantageously, such a connection using a pair of springs 26 preferably forms a grounding bond connection between the two lower mounting bases 20.

In alternate embodiments, lower module supports 22 can instead comprise wraparound supports having top parts received over the top edge of the photovoltaic module and bottom parts received under the bottom edge of the photovoltaic module). In such embodiments, suitable connectors and fasteners can be used to attach the lower sides 13 of photovoltaic modules 15 to each wraparound support 22, all keeping within the scope of the present invention. In these embodiments, wraparound supports 22 may or may not be pivot-locking connectors. For example, drop in slots of the bottom edges of the modules would also work. In fact, any connection system where the installer could connect the lower side 13 of module 15 to connectors 22 while standing at the peak P would be sufficient, all keeping within the scope of the present invention.

As further illustrated in FIGS. 6A, 6B and 6C, a sliding support 31 may be connected to slide up and down along the upper end of each bar 40. Sliding supports 31 are each dimensioned to connect to an upper side 17 of a photovoltaic module to support the upper side of the photovoltaic module.

Preferably, sliding support 31 has an aperture 37 passing therethrough. Bar 40 is received within aperture 37. Aperture 37 has a central longitudinal axis C that is not collinear with the central longitudinal axis B of bar 40. As seen in FIG. 6C, sliding support 31 pivot-locks onto bar 40 when rotated about axis A (FIG. 6A) in direction R. Axis A is perpendicular to the central longitudinal axis B of bar 40. Axis A also extends parallel to upper side 17 of the photovoltaic module. Sliding support 31 optionally has an engaging portion 33 mounted thereon. Engaging portion 33 is inserted into the side groove in the module frame and rotated such that it locks into the module frame. At this time, when engaging portion 33 is tightened into the module frame groove, sliding support 31 will pivot slightly (about axis A) such that the top and bottom edges of aperture 37 bear against the top and bottom of bar 40, as shown. As such, sliding support 31 will then be in a locked position and prevented from sliding up or down bar 40.

FIG. 6D is a perspective view of an alternate wraparound sliding support 31A. In this embodiment, wraparound sliding support 31A has top and bottom parts 31A1 and 31A2. Parts 31A1 and 31A2 can be fastened together by screw 31A3 (or other clamping mechanisms), all keeping within the scope of the present invention. When parts 31A1 and 31A2 are tightened together onto the top and bottom of the module frame, sliding support 31A will pivot about axis A (in the same manner as described above with respect to the embodiment in FIG. 6C), thereby locking sliding support 32A onto a fixed position on bar 40.

A further aspect of the present system is that snap-fit connectors can be provided to attach opposite ends of bar 40 to each of lower mounting bases 20 and upper mounting bases 30. As seen in FIGS. 6A and 6B, bar 40 preferably has a pair of snap connectors 41 at its lower end (such that it can be snap-fit into holes 21 in lower base 20), and a pair of snap connectors 43 at its upper end (such that it can be snap-fit into holes in upper base 30). Connectors 41 and 43 are simply compressed (to be flush with the outside of the tube of bar 40) when the ends of bars 40 are inserted into each of lower and upper supports 20 and 30. When released, snap-connectors 41 will project out of holes 21 in lower base 20. Similarly, snap connectors 43 (when released) will project out of holes in upper base 30. The advantage of using snap-connectors 41 and 43 are that the entire array can be constructed (i.e., bars 40 are positioned between respective bases 20 and 30) without the use of any additional tools. Rather, the components can be simply snap-fit together. As can be appreciated by one of ordinary skill in the art, snap-connectors 41 and 43 operate to provide a system that can be rapidly and easily assembled using no special tools or hardware. Moreover, such snap-connectors 41 and 43 can also be used to quickly and easily disassemble the array's supporting structure (should elements of the array ever need to be replaced).

FIGS. 6A and 6B show further details of sliding supports 31, as follows. Upper module support 32 may optionally have a rotating connector comprising a rotating gripping portion 35. During installation, the installer will simply slide support 31 along bar 40 to a position such that engaging portion 33 can be inserted within a groove in the frame of the upper side 17 of the photovoltaic module. Then, the installer uses a torque enhancing tool to turn gripping portion 35 by ninety degrees such that engaging portion 33 also rotates by ninety degrees and locks into a groove running along the top of the photovoltaic module.

As can be appreciated by one of ordinary skill in the art, the present "lower pivot locking and upper sliding locking" system has many advantages. For example, it can be installed quickly and easily with the installer simply standing in peak gap 19 and pivot-lowering the modules into position. As was stated, the installer simply first positions lower sides 13 of the modules onto lower module supports 22. Next, the installer lowers upper sides 17 of each module down into position. Next, the installer secures upper side 17 into place with rotatable locks on engaging portion 33. Advantageously as well, gripping portion 35 preferably needs only be turned 90 degrees to lock engaging portion 33 into position within the groove on upper side 17. As was shown, sliding supports 31 are designed to not slide along bar 40 after engaging portion 33 has been locked into the groove on side 17 of the module frame, thereby constraining motion of the upper module support 32 along bar 40, further securing the assembly together.

Figure 7A:
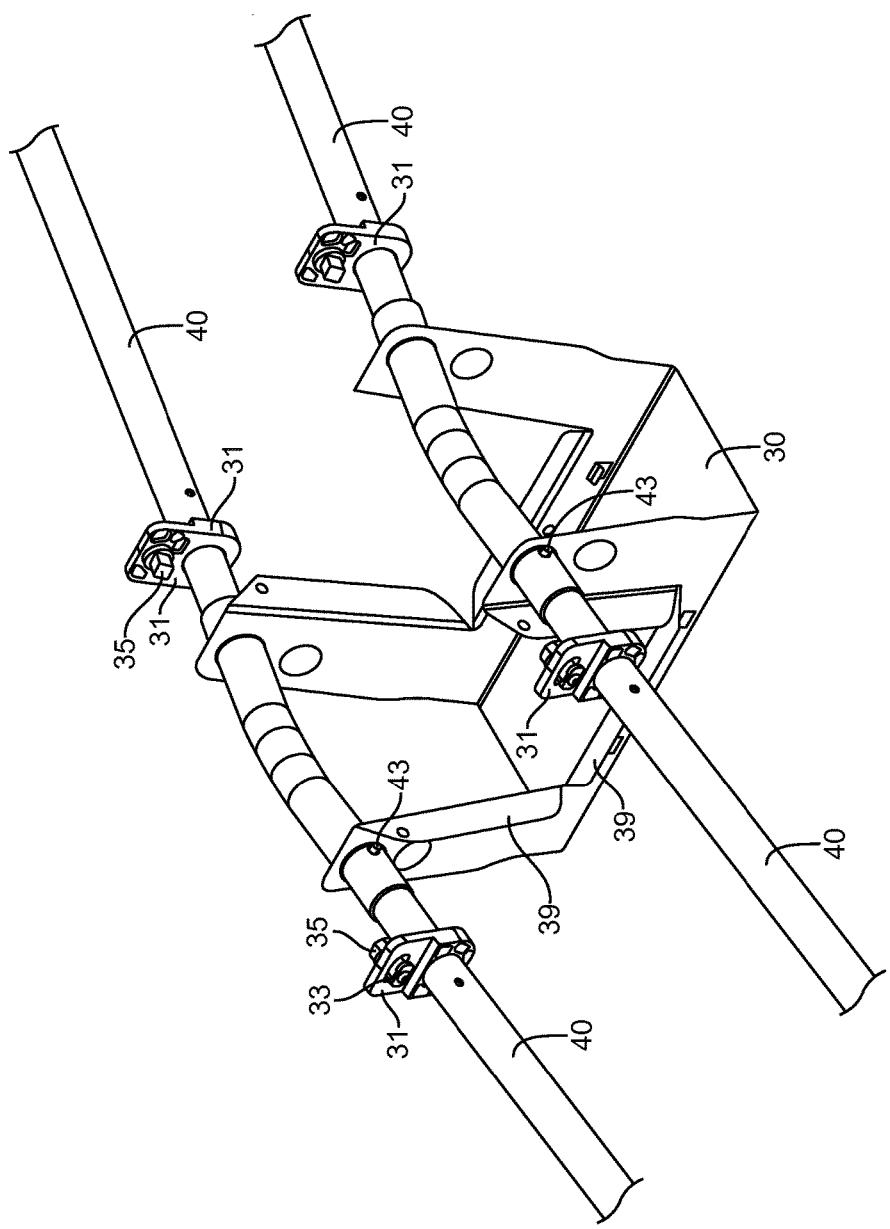
FIG. 7A is a close-up perspective view of a preferred embodiment of the upper mounting base.
Figure 7B:
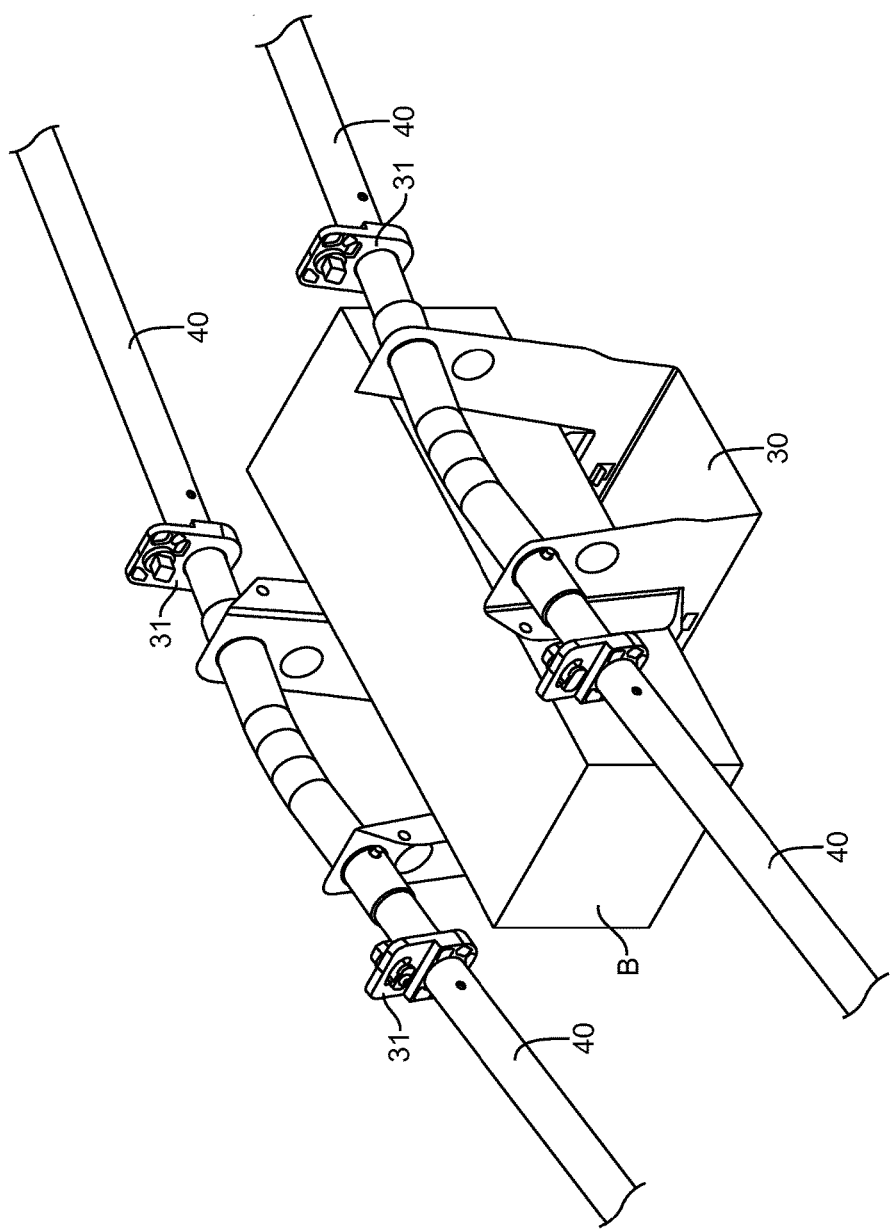
FIG. 7B adds a ballast block to FIG. 7A.

FIG. 7A is a close-up perspective view of a preferred embodiment of the upper mounting base 30. FIG. 7B adds an optional ballast block B. In this embodiment, upper mounting base 30 can be made of a single piece of stamped sheet metal. One or two ballast blocks B can be received into the upper base, as desired. Preferably, upper base 38 also has flexible ears 39. Therefore, when the ballast blocks are placed in to upper base 38, they bend ears 39, helping to lock the ballast blocks into position.

Another advantage of snap-connectors 41 and 43 is that they maintain grounding between the upper and lower mounting bases 30 and 20. In preferred embodiments, such grounding is maintained even when bars 40 are rotated slightly about their longitudinal axis B (FIGS. 6A and 6B) with respect to the upper and lower mounting bases. Such rotation of bar 40 about longitudinal axis A may occur for several reasons, including installation on uneven roofing surfaces, during the installation process, or during wind events.

Figure 7C:
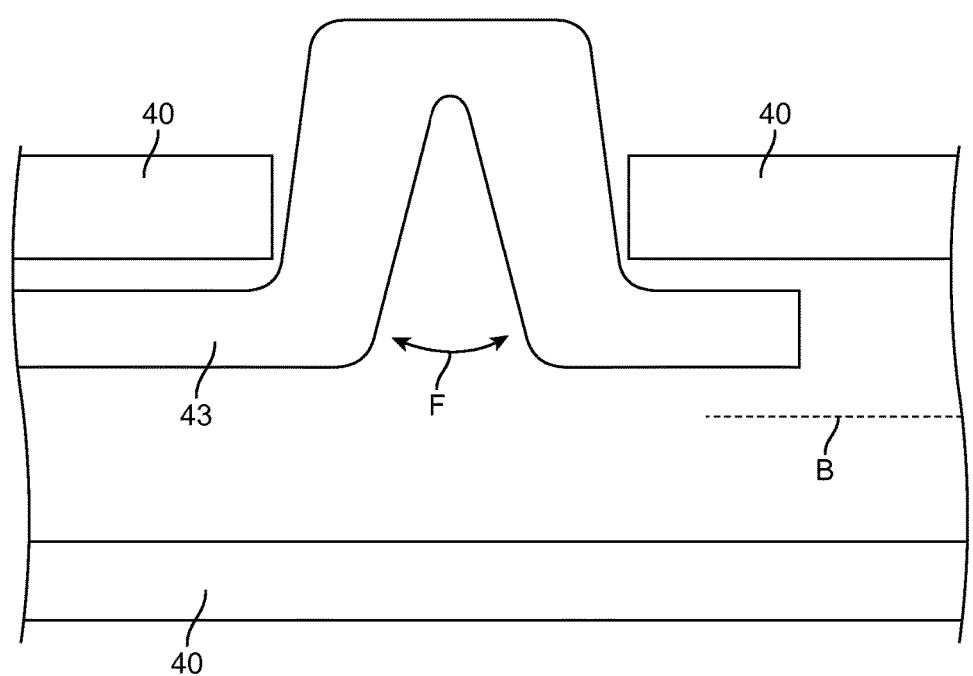
FIG. 7C is an illustration of an exemplary pin connector received into a pin-receiving hole.

FIG. 7C shows a novel snap-fit pin connection system in which contact between the pin 43 (or 41) and the hole through which it protrudes (either on the upper or lower mounting bases). As illustrated pin 43 is adapted to flex inwardly or outwardly in direction F such that it continues to contact with, and protrude out of, the hole in the side of bar 40 even as the bar 40 is twisted somewhat about its longitudinal axis B. The advantage of this design is that grounding between the bar 40 and either of the upper low rower mounting bases can be maintained, even if bar 40 is slightly rotated.

Figure 8A:
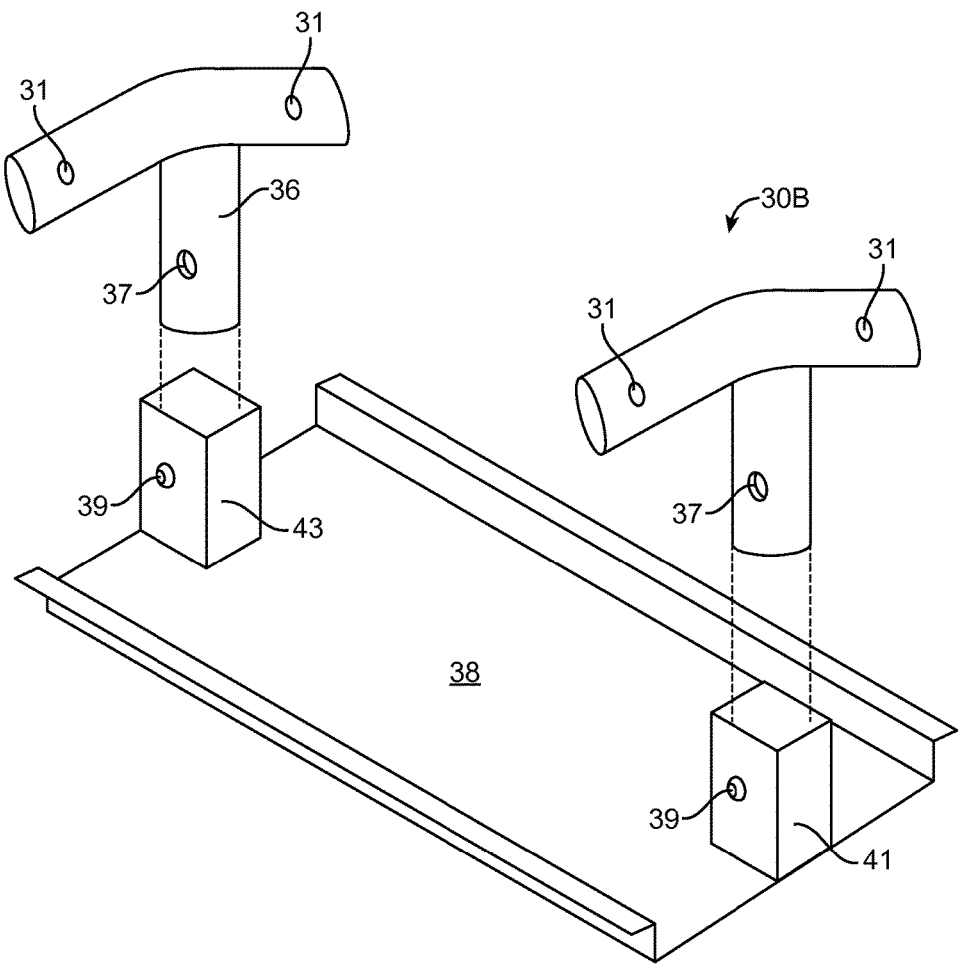
FIGS. 8A to 8C show an alternate embodiment of the upper base that is snap-fit together.
Figures 8B, 8C:
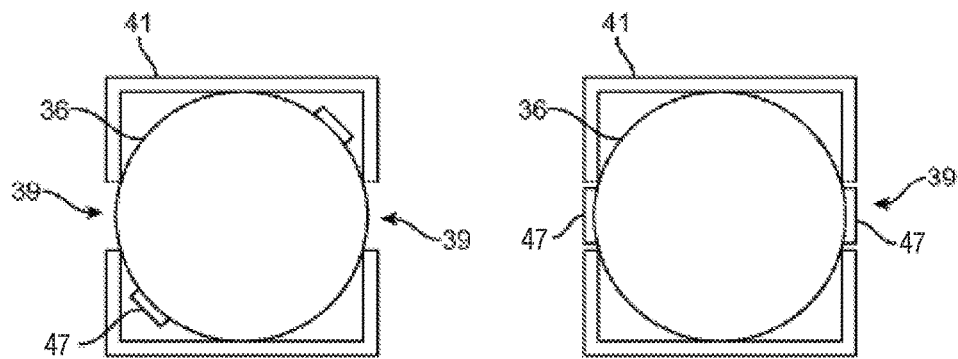

FIG. 8A is a perspective view of an alternate upper base 30B. As can be seen, base 30B comprises a pair of top T-shaped connectors 36 that are connected to a base plate 38. Preferably, the connectors 36 are snap-fit into base plate 38. This process is further illustrated in FIGS. 8B and 8C where T-shaped connectors 36 have snap-connectors 47 protruding therefrom. First, as seen in FIG. 8B, T-shaped connectors 36 are inserted downwardly into square receptacles 43 (the upper end of T-shaped connector 36 is shown in dotted lines for clarity). Next, as seen in FIG. 8C, the installer grabs onto to the top of T-shaped connector 36 and twists it such that snap-connectors 47 pop out of holes 39. Thus, a simple twist of T-shaped connectors 36 is all that is required to lock them into base plate 38. The design of snap-connectors 36 is preferably similar to pin connector 41 in FIG. 7C.

A further important advantage of the present invention is its ability to cope with thermal expansion and contraction of the photovoltaic modules 15. For example, modules 15 do not touch one another at their sides (as seen in FIGS. 1A and 1B). Therefore, the modules can expand and contract in the X-direction by the lower sides 13 of the modules sliding across lower supports 22 (and also across optional bottom alignment bracket 24). Similarly, the upper sides 17 of the modules can slide across the engaging portions 33 of sliding supports 31.

Thermal expansion and contraction in the Y-direction can be accommodated by upper module support 32 sliding small distances up and down along bars 40. In addition, the relatively loose nature of pin-in-hole connectors 41 and 43 also permits slight movement in the Y-direction (and long the central longitudinal axis A of the bars 40). Lastly, slight twisting rotation about the center axis B of each of bars 40 can also be accommodated by the relatively loose nature of pin-in-hole connectors 41 and 43, as was explained above. Therefore, in addition to compensating well for thermal expansion, the present systems' looseness of parts permits ease of placement on an un-level roof.

Additionally, optional bottom stiffener 24 also advantageously resists wind loading since modules 15 are free to slide side-to-side during thermal expansion and contraction, but transfers loads between modules 15A and 15B when one of the modules is lifted by the wind.

Furthermore, pairs of lower mounting bases 20 can rotate around springs 26 (which connect them together). This feature permits flexing of the array, and also permits pairs of bases 20 to be positioned on uneven ground. Finally, further flexing of the array can be accommodated by the upwardly extending portions of the two sides of upper mounting base 30 flexing either closer together or farther apart. Such flexing can help to accommodate thermal expansion and contraction of the modules in the array.

Figure 9B:
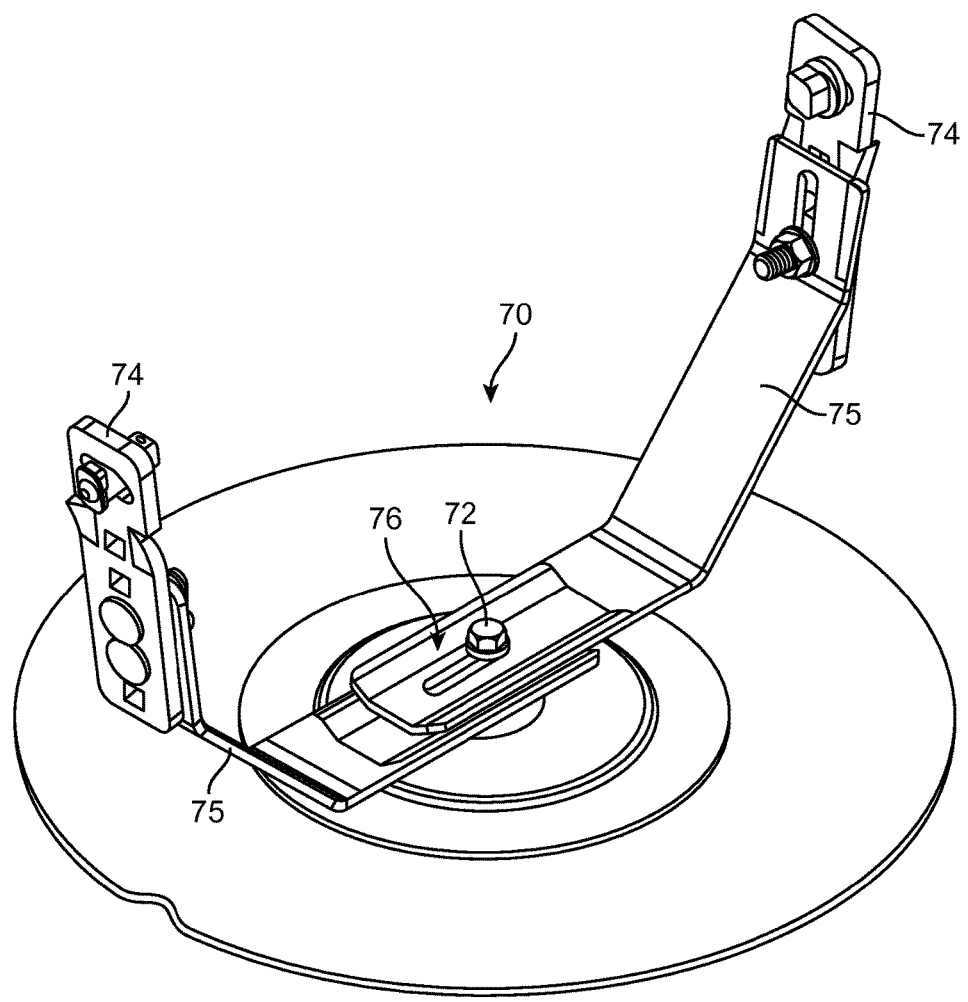
FIG. 9B is a perspective view of a second positive attachment system.

Lastly, FIGS. 9A and 9B show two different attachment systems for securing array 10 to the roof of a building. Specifically, as seen in FIG. 9A, system 60 is fastened to a building rafter by a central bolt 62 positioned in the aisle way formed in upper gap 19. Four fasteners 64 are then attached to upper sides 17 of two modules 15 (not shown) that sit on either side of gap 19. Four fasteners 64 are held in place by cables 65. As such, positive attachment system 60 provides a tension system connecting the upper sides 17 of two modules 15 directly to the building rafters. It is to be understood that system 60 is an optional add-on and that the present system encompasses embodiments without system 60 being added thereto. FIG. 9B shows an alternate positive attachment system 70 that also has a central bolt 72 positioned in the aisle way formed in upper gap 19. Two fasteners 74 are then attached to upper sides 17 of two modules 15 (not shown) that sit on either side of gap 19. A bracket 75 connects central bolt 72 to the two fasteners 74. Preferably, bracket 75 is a two-piece bracket with overlapping slots 76, permitting the spacing between fasteners 74 to be adjusted to accommodate the particular gap 19 spacing that is used.

It is to be understood that the present invention is not to be limited in scope by the specific embodiments described herein. Indeed, various modifications of the embodiments of the present inventions, in addition to those described herein, will be apparent to those of ordinary skill in the art from the foregoing description and accompanying drawings and claims. Accordingly, this disclosure should be construed in view of the full breath and spirit of the embodiments of the present inventions as disclosed herein and claimed below.

What is claimed is:

1. A photovoltaic mounting system, comprising:
   (a) a first lower mounting base having at least one first photovoltaic module support;
   (b) a second lower mounting base having at least one second photovoltaic module support;
   (c) an upper mounting base positioned between the first lower mounting base and the second lower mounting base in a horizontal plane;
   (d) a bar connecting the first lower mounting base to the second lower mounting base through the upper mounting base, the bar extending downward at an angle with respect to the horizontal plane from the upper mounting base to each of the first and second lower mounting bases; and
   (e) a pair of sliding supports located on either side of the upper mounting base, each sliding support comprising a photovoltaic module connector, wherein each sliding support has an aperture to receive the bar passing therethrough, and wherein the aperture has a central longitudinal axis that extends in a direction that is not collinear with a central longitudinal axis of the bar.

2. The system of claim 1, wherein each sliding support pivot locks onto the bar when the connector on the sliding support is secured to the upper side edge of a photovoltaic module.

3. The system of claim 2, wherein each sliding support pivot locks onto the bar by being rotated about an axis that is perpendicular to the longitudinal axis of the bar.

4. The system of claim 1, wherein the connector in the photovoltaic module support on the lower mounting base receives the lower side edge of a photovoltaic module pivot-dropped thereon.

5. The system of claim 4, wherein the connector in the photovoltaic module support in the lower mounting base is a rock-it connector that is received into a side groove in a frame of the photovoltaic module.

6. The system of claim 4, wherein the connector in the photovoltaic module support in the lower mounting base is a wrap-around connector that wraps around a frame of the photovoltaic module.

7. A method of assembling a photovoltaic array, comprising:
   (a) positioning a first lower mounting base on a surface, the first lower mounting base having at least one first photovoltaic module support;
   (b) positioning a second lower mounting base on the surface, the second lower mounting base having at least one second photovoltaic module support;
   (c) positioning an upper mounting base on the surface between the first lower mounting base and the second lower mounting base along a horizontal plane between the first lower mounting base and the second lower mounting base; and
   (d) connecting the first lower mounting base to the second lower mounting base through the upper mounting base with a bar, such that the bar extends downward at an angle, with respect to the horizontal plane, from the upper mounting base to each of the first and second lower mounting bases;
   (e) placing a lower side edge of a photovoltaic module onto a connector on the first lower mounting support;
   (f) lowering an upper side edge of the photovoltaic module towards the bar;
   (g) sliding a sliding support on the bar down to a position adjacent to the upper side edge of the photovoltaic module, wherein the sliding support has an aperture which has a central longitudinal axis that extends in a direction that is not collinear with a central longitudinal axis of the bar; and then
   (h) connecting the sliding support onto the upper side edge of the photovoltaic module.

8. The method of claim 7, wherein the bar is snap-fit connected onto the upper and lower mounting supports.

9. The method of claim 7, wherein connecting the sliding support onto the upper side edge of the photovoltaic module comprises pivot locking the sliding support onto the bar by rotating the sliding support about an axis that is perpendicular to the longitudinal axis of the bar and parallel to the upper side edge of the photovoltaic module.

10. The method of claim 7, wherein lowering the upper side edge of the photovoltaic module towards the bar pivot locks the lower side edge of the photovoltaic module onto the connector on the lower mounting base.

11. The method of claim 7, wherein lowering an upper side edge of the photovoltaic module towards the bar comprises moving the photovoltaic module to a position parallel to the bar.

12. The method of claim 7, wherein placing a lower side edge of a photovoltaic module onto the connector on the lower mounting base comprises inserting the connector on the lower mounting support into a side groove in the lower side edge of the photovoltaic module.

13. The method of claim 7, wherein connecting the sliding support onto the upper side edge of the photovoltaic module comprises inserting a connector on the sliding support into a side groove in the upper side edge of the photovoltaic module.

14. The system of claim 1, wherein the upper mounting base is configured in part to define a peak of the photovoltaic mounting system.

15. The system of claim 1, wherein the first lower mounting base is configured in part to define a valley of the photovoltaic mounting system.

16. The system of claim 1, wherein the first lower mounting base comprises a pair of opposite facing photovoltaic module supports.

17. The system of claim 1, wherein the bar comprises first and second bars coupled by a connector.

\* \* \* \* \*